(12) United States Patent
Liu et al.

(10) Patent No.: US 9,331,165 B2
(45) Date of Patent: May 3, 2016

(54) THIN-FILM TRANSISTOR (TFT), MANUFACTURING METHOD THEREOF, ARRAY SUBSTRATE, DISPLAY DEVICE AND BARRIER LAYER

(71) Applicant: BOE TECHNOLOGY GROUP CO., LTD., Beijing (CN)

(72) Inventors: Xiang Liu, Beijing (CN); Gang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 109 days.

(21) Appl. No.: 14/127,858

(22) PCT Filed: Oct. 30, 2013

(86) PCT No.: PCT/CN2013/086250
§ 371 (c)(1),
(2) Date: Dec. 19, 2013

(87) PCT Pub. No.: WO2014/067463
PCT Pub. Date: May 8, 2014

(65) Prior Publication Data
US 2015/0214320 A1    Jul. 30, 2015

(30) Foreign Application Priority Data

Nov. 2, 2012   (CN) .......................... 2012 1 0434914
Nov. 2, 2012   (CN) ...................... 2012 2 0575529 U

(51) Int. Cl.
*H01L 21/00* (2006.01)
*H01L 29/49* (2006.01)
(Continued)

(52) U.S. Cl.
CPC .......... *H01L 29/4966* (2013.01); *H01L 27/124* (2013.01); *H01L 27/1225* (2013.01);
(Continued)

(58) Field of Classification Search
CPC .................. H01L 29/66969; H01L 29/78606; H01L 29/495
USPC ............................................. 438/164; 257/60
See application file for complete search history.

(56) References Cited

U.S. PATENT DOCUMENTS

2008/0296568 A1    12/2008   Ryu et al.
2009/0153056 A1    6/2009    Chen et al.
(Continued)

FOREIGN PATENT DOCUMENTS

CN   102956713 A    3/2013
CN   102956715 A    3/2013
(Continued)

OTHER PUBLICATIONS

Korean Office Action dated May 1, 2015, Appln. No. 10-2014-7005593.
(Continued)

*Primary Examiner* — Caridad Everhart
(74) *Attorney, Agent, or Firm* — Ladas & Parry LLP

(57) ABSTRACT

The present invention discloses a thin-film transistor (TFT), a manufacturing method thereof, an array substrate and a display device. The present invention is used for improving the electrical properties of the TFT and the image quality of the display device. The TFT provided by the present invention comprises: a gate electrode, a source electrode, a drain electrode, a semiconductor layer, a gate electrode insulating layer and a first metal barrier layer, which are disposed on a substrate; the gate electrode insulating layer is disposed between the gate electrode and the semiconductor layer; and the first metal barrier layer is disposed between the source/drain electrodes and the gate electrode insulating layer, and the first metal barrier layer is arranged on the same layer as the semiconductor layer and configured to prevent interdiffusion between the material for forming the source/drain electrodes and the material for forming the gate electrode.

44 Claims, 6 Drawing Sheets

(51) Int. Cl.
   *H01L 29/45* (2006.01)
   *H01L 29/786* (2006.01)
   *H01L 27/12* (2006.01)
   *H01L 29/66* (2006.01)

(52) U.S. Cl.
   CPC ............ *H01L27/1259* (2013.01); *H01L 29/45* (2013.01); *H01L 29/495* (2013.01); *H01L 29/66969* (2013.01); *H01L 29/7869* (2013.01)

(56) References Cited

U.S. PATENT DOCUMENTS

| | | |
|---|---|---|
| 2010/0200843 A1 | 8/2010 | Arai et al. |
| 2013/0207114 A1 | 8/2013 | Suzuki et al. |
| 2014/0110716 A1 | 4/2014 | Liu et al. |

FOREIGN PATENT DOCUMENTS

| | | |
|---|---|---|
| CN | 202855742 U | 4/2013 |
| JP | 4928464 B2 | 2/2012 |
| KR | 20080104860 A | 12/2008 |
| KR | 20100091108 A | 8/2010 |
| KR | 20110044633 A | 4/2011 |
| TW | 200928531 A | 7/2009 |
| WO | 2011/142064 A1 | 11/2011 |
| WO | 2011/162177 A1 | 12/2011 |

OTHER PUBLICATIONS

First Chinese Office Action dated Nov. 26, 2015; Appln. No. 201380002182.X.
Korean Examination Opinion dated Nov. 11, 2015; Appln. No. 10-2014-7005593.
Korean Examination Opinion dated Jan. 14, 2016; Appln. No. 10-2014-7005593.
Written Opinion of the International Searching Authority Dated Jan. 27, 2014; PCT/CN2013/086250.
First Chinese Office Action Appln. No. 201210434914.X: Dated Sep. 23, 2014.
International Search Report issued Jan. 26, 2014; PCT/CN2013/086250.

THIN-FILM TRANSISTOR (TFT), MANUFACTURING METHOD THEREOF, ARRAY SUBSTRATE, DISPLAY DEVICE AND BARRIER LAYER

TECHNICAL FIELD

The present invention relates to the field of display technology, and in particular to a thin-film transistor (TFT), a manufacturing method thereof, an array substrate, a display device and a barrier layer.

BACKGROUND

Flat-panel display devices such as liquid crystal displays (LCDs) and organic light-emitting diode (OLED) displays in the field of display technology have occupied a special place in the field of flat-panel display due to the advantages of light weight, small thickness, low power consumption, high brightness, high definition and so on. In particular, large-size, high-resolution and high-definition flat-panel display devices such as LCD TVs have been dominant in the current flat-panel display market.

Currently, image signal delay is a key factor restricting a large-size, high-resolution and high-definition flat-panel display device. More specifically, image signal delay is mainly determined by the signal resistance R of gate electrodes, gate lines or data lines and relevant capacitance C on a substrate. With the constantly increased size of the display device and the constantly increased resolution, the signal frequency applied by a drive circuit is constantly increased as well; and image signal delay becomes more seriously. In an image display period, a gate line is turned on and pixels are charged; but due to image signal delay, some pixels are not sufficiently charged, resulting in the non-uniform brightness in the displayed images and hence seriously affecting the display quality of the images. In addition, when the resistance of gate electrodes, gate lines or data lines is reduced, image signal delay is reduced, and hence the image quality can be improved.

At present, the method for reducing the resistance of gate lines and data lines mainly is to adopt a low-resistance metal copper (Cu) to manufacture gate lines and data lines. However, the method has the following disadvantages:

As copper (Cu) ions can be easily diffused, and particularly diffused to a gate electrode protective layer, a semiconductor layer or a passivation layer at a high temperature, the performances of a thin film transistor (TFT) can be seriously affected. In particular, in the subsequent high-temperature heating processes on the TFT, due to the increased activity, the copper (Cu) ions can penetrate through an insulating barrier layer and into the semiconductor layer, and hence the performances of the TFT can be seriously affected, and consequently the image quality may become poorer, and even the normal operation of the TFT can be destroyed.

TFTs on a traditional substrate and the manufacturing method thereof have the problems of reduced TFT performances and poorer image quality.

SUMMARY

Embodiments of the present invention provide a thin film transistor (TFT), a manufacturing method thereof, an array substrate, a display device and a barrier layer. The present invention is used for improving the performances of the TFT and hence improving image quality.

To realize the above objection, a thin-film transistor (TFT) of an embodiment of the invention comprises: a gate electrode, a source electrode, a drain electrode, a semiconductor layer, a gate electrode insulating layer and a first metal barrier layer, which are disposed on a substrate; the gate electrode insulating layer is disposed between the gate electrode and the semiconductor layer; and the first metal barrier layer is disposed between the source/drain electrodes and the gate electrode insulating layer, and the first metal barrier layer is arranged on the same layer as the semiconductor layer and configured to prevent interdiffusion between the material for forming the source/drain electrodes and the material for forming the gate electrode.

For example, preferably, the TFT further comprises an etching barrier layer disposed between the source/drain electrodes and the semiconductor layer.

For example, preferably, the first metal barrier layer is insulated from the semiconductor layer.

For example, preferably, at least one of the material for forming the source/drain electrodes and the material for forming the gate electrode is copper or copper alloy, which can reducing image signal delay and improve image quality.

For example, preferably, where the TFT is an oxide TFT, the semiconductor layer is a metal oxide semiconductor layer.

For example, preferably, the first metal barrier layer is made of the same material as the semiconductor layer. First, the metal oxide semiconductor layer has the function to prevent the interdiffusion between the material for forming the source/drain electrodes and the material for forming the gate electrode, and secondly, a same material forms the first metal barrier layer and the semiconductor layer, which simplifies the process flow.

For example, preferably, the first metal barrier layer is a copper oxide film layer, a copper nitride film layer or a copper oxynitride film layer, which has the function to prevent the interdiffusion between the material for forming the source/drain electrodes and the material for forming the gate electrode.

For example, preferably, the first metal barrier layer is made of a metal oxide semiconductor material different from that of the semiconductor layer. Because the metal oxide semiconductor material can prevent the interdiffusion between the material for forming the source/drain electrodes and the material for forming the gate electrode, it can improve the performances of the TFT and image quality.

For example, preferably, the TFT further comprises: a second metal barrier layer disposed between the first metal barrier layer and the source/drain electrodes and configured to prevent the interdiffusion between the material for forming the source/drain electrodes and the material for forming the gate electrode so as to further improve the performances of the TFT and image quality.

For example, preferably, the material for forming the source/drain electrodes is copper or copper alloy, which has low resistance to lower image signal delay and improve image quality.

For example, preferably, the second metal barrier layer is a copper oxide film layer, a copper nitride film layer or a copper oxynitride film layer.

For example, preferably, the second metal barrier layer is made of a metal oxide semiconductor material having the function to prevent the interdiffusion between the material for forming the source/drain electrodes and the material for forming the gate electrode.

For example, preferably, the structure of the TFT is as follows: the gate electrode is disposed on the substrate; the gate electrode insulating layer is disposed on the gate electrode; the semiconductor layer and the first metal barrier layer are disposed on the gate electrode insulating layer; the etching barrier layer is disposed on the semiconductor layer; and the second metal barrier layer is disposed on the semiconductor layer and the first metal barrier layer, and a source/drain electrode layer is disposed on the second metal barrier layer.

Or, the structure of the TFT is as follows: the source/drain electrode layer is disposed on the substrate; the second metal barrier layer is disposed on the source/drain electrode layer; the etching barrier layer is disposed on the second metal barrier layer; the semiconductor layer and the first metal barrier layer are disposed on the etching barrier layer; the gate electrode insulating layer is disposed on the semiconductor layer; and the gate electrode is disposed on the gate electrode insulating layer.

For example, preferably, the structure of the TFT is as follows: the gate electrode is disposed on the substrate; the gate electrode insulating layer is disposed on the gate electrode; the semiconductor layer and the first metal barrier layer are disposed on the gate electrode insulating layer; and the source electrode and the drain electrode are disposed on the first metal barrier layer.

Or, the structure of the TFT is as follows: the source electrode and the drain electrode are disposed on the substrate; the semiconductor layer and the first metal barrier layer are disposed on the source electrode and the drain electrode; the gate electrode insulating layer is disposed on the semiconductor layer and the first metal barrier layer; and the gate electrode is disposed on the gate electrode insulating layer.

For example, preferably, the structure of the TFT is as follows: the gate electrode is disposed on the substrate; the gate electrode insulating layer is disposed on the gate electrode; the semiconductor layer and the first metal barrier layer are disposed on the gate electrode insulating layer; the second metal barrier layer is disposed on the semiconductor layer and the first metal barrier layer; and the source electrode and the drain electrode are disposed on the first metal barrier layer.

Or, the structure of the TFT is as follows: the source electrode and the drain electrode are disposed on the substrate; the second metal barrier layer is disposed on the source electrode and the drain electrode; the semiconductor layer and the first metal barrier layer are disposed on the second metal barrier layer; the gate electrode insulating layer is disposed on the semiconductor layer and the first metal barrier layer; and the gate electrode is disposed on the gate electrode insulating layer.

For example, preferably, the first metal barrier layer is disposed at a position corresponding to the source electrode and the drain electrode, so as to simplify the structure of the TFT as much as possible.

For example, preferably, the second metal barrier layer is disposed at a position corresponding to the source electrode and the drain electrode, so as to simplify the structure of the TFT as much as possible.

An array substrate provided by an embodiment of the invention comprises the TFT which is provided with a first metal barrier layer only, and the first metal barrier layer prevents the interdiffusion between the material for forming the source/drain electrodes and the material for forming the gate electrode, thus improving the performances of the TFT and image quality.

For example, preferably, the array substrate further comprises: a data line and a gate line, in which the data line is connected with the source electrode of the TFT; the gate line is connected with the gate electrode of the TFT; and the first metal barrier layer is disposed at a position corresponding to the source electrode, the drain electrode and the data line; or, the first metal barrier layer is disposed at a position corresponding to the source electrode, the drain electrode and the gate line; or, the first metal barrier layer is disposed at a position corresponding to the source electrode, the drain electrode, the gate line and the data line, and the first metal barrier layer prevents the interdiffusion between the material for forming the source/drain electrodes and the material for forming the gate electrode, thus improving the performances of the TFT and image quality, and at the same time further prevent interdiffusion between the materials for the gate line and the data line, thus improving the performances of the TFT and image quality.

An array substrate provided by an embodiment of the invention comprises the TFT which is provided with both the first metal barrier layer and the second metal barrier layer, for further improving the performances of the TFT and image quality.

For example, preferably, the array substrate further comprises: a data line and a gate line, in which the data line is connected with the source electrode of the TFT; the gate line is connected with the gate electrode of the TFT;

the first metal barrier layer is disposed at a position corresponding to the source electrode, the drain electrode and the data line; or, the first metal barrier layer is disposed at a position corresponding to the source electrode, the drain electrode and the gate line; or, the first metal barrier layer is disposed at a position corresponding to the source electrode, the drain electrode, the gate line and the data line; and/or the second metal barrier layer is disposed at a position corresponding to the source electrode, the drain electrode and the data line; or, the second metal barrier layer is disposed at a position corresponding to the source electrode, the drain electrode and the gate line; or, the second metal barrier layer is disposed at a position corresponding to the source electrode, the drain electrode, the gate line and the data line. The provision of the second metal barrier layer can further prevent the interdiffusion between the materials for forming the source electrode, drain electrode, the data line, and the gate line, further improving the performances of the TFT and image quality.

A display device provided by an embodiment of the invention comprises the above array substrate, comprising the TFT which is provided with a first metal barrier layer only, and can realize a display device having small image signal delay and good image quality.

A display device provided by an embodiment of the invention comprises the array substrate the above array substrate, comprising the TFT which is provided with both the first metal barrier layer and the second metal barrier layer, and can realize a display device having small image signal delay and good image quality.

A method for manufacturing a TFT provided by an embodiment of the invention, comprises: forming patterns of a gate electrode, a source electrode, a drain electrode and a semiconductor layer; and forming patterns of a gate electrode insulating layer and a first metal barrier layer, in which the gate electrode insulating layer is disposed between the gate electrode and the semiconductor layer; and the first metal barrier layer is disposed between the source/drain electrodes and the gate electrode insulating layer and arranged on the same layer as the semiconductor layer. The first metal barrier layer can prevent the interdiffusion between the material for forming the source/drain electrodes and the material for forming the gate electrode, thus improving the performances of the TFT and image quality For example, preferably, the method further comprises the process of forming a pattern of an etching barrier layer, in which the etching barrier layer is disposed between the semiconductor layer and the source/drain electrodes. The etching barrier layer is provided to prevent the influence on the semiconductor in etching of the source and drain electrodes.

For example, preferably, the first metal barrier layer is insulated from the semiconductor layer.

For example, preferably, where the TFT is an oxide TFT, the semiconductor layer is made of a metal oxide semiconductor material.

For example, preferably, the method further comprises the process of forming a pattern of a second metal barrier layer, in which the second metal barrier layer is disposed between the first metal barrier layer and the source/drain electrodes, which can further improve the performances of the TFT and image quality.

For example, preferably, the process of forming the patterns of the gate electrode, the source electrode, the drain electrode, the semiconductor layer, the gate electrode insulating layer and the first metal barrier layer comprises: forming the pattern of the gate electrode on the substrate by a patterning process; forming the pattern of the gate electrode insulating layer on the substrate, on which the pattern of the gate electrode is formed, by a patterning process; forming the patterns of the semiconductor layer and the first metal barrier layer on the substrate, on which the pattern of the gate electrode insulating layer is formed, by one patterning process; and forming the patterns of the source electrode and the drain electrode on the substrate, on which the patterns of the semiconductor layer and the first metal barrier layer are formed, by one patterning process.

Or, the process of forming the patterns of the gate electrode, the source electrode, the drain electrode, the semiconductor layer, the gate electrode insulating layer and the first metal barrier layer comprises: forming the patterns of the source electrode and the drain electrode on the substrate by one patterning process; forming the patterns of the semiconductor layer and the first metal barrier layer on the substrate, on which the patterns of the source electrode and the drain electrode are formed, by one patterning process; forming the pattern of the gate electrode insulating layer on the substrate, on which the pattern of the semiconductor layer and the first metal barrier layer are formed, by a patterning process; and forming the pattern of the gate electrode on the substrate, on which the pattern of the gate electrode insulating layer is formed, by a patterning process.

For example, preferably, the process of forming the patterns of the gate electrode, the source electrode, the drain electrode, the semiconductor layer, the gate electrode insulating layer, the etching barrier layer, the first metal barrier layer and the second metal barrier layer comprises: forming the pattern of the gate electrode on the substrate by a patterning process; forming the pattern of the gate electrode insulating layer on the substrate, on which the pattern of the gate electrode is formed, by a patterning process; forming the patterns of the semiconductor layer and the first metal barrier layer on the substrate, on which the pattern of the gate electrode insulating layer is formed, by one patterning process; forming the pattern of the etching barrier layer on the substrate, on which the patterns of the semiconductor layer and the first metal barrier layer are formed, by a patterning process; and forming the patterns of the source electrode, the drain electrode and the second metal barrier layer on the substrate, on which the pattern of the etching barrier layer is formed, by one patterning process.

Or, the process of forming the patterns of the gate electrode, the source electrode, the drain electrode, the semiconductor layer, the gate electrode insulating layer, the etching barrier layer, the first metal barrier layer and the second metal barrier layer comprises: Ruining the patterns of the source electrode, the drain electrode and the second metal barrier layer on the substrate by one patterning process; forming the pattern of the etching barrier layer on the substrate, on which the patterns of the source electrode, the drain electrode and the second metal barrier layer are formed, by a patterning process; forming the patterns of the semiconductor layer and the first metal barrier layer on the substrate, on which the pattern of the etching barrier layer is formed, by one patterning process; forming the pattern of the gate electrode insulating layer on the substrate, on which the patterns of the semiconductor layer and the first metal barrier layer are formed, by a patterning process; and forming the pattern of the gate electrode on the substrate, on which the pattern of the gate electrode insulating layer is formed, by a patterning process.

For example, preferably, the process of forming the patterns of the gate electrode, the source electrode, the drain electrode, the semiconductor layer, the gate electrode insulating layer, the first metal barrier layer and the second metal barrier layer comprises: forming the pattern of the gate electrode on the substrate by a patterning process; forming the pattern of the gate electrode insulating layer on the substrate, on which the pattern of the gate electrode is formed, by a patterning process; forming the pattern of the semiconductor layer on the substrate, on which the pattern of the gate electrode insulating layer is formed, by a patterning process; forming the pattern of the first metal barrier layer on the substrate, on which the pattern of the semiconductor layer is formed, by a patterning process; and forming the patterns of the source electrode, the drain electrode and the second metal barrier layer on the substrate, on which the pattern of the first metal barrier layer is formed, by one patterning process.

Or, the process of forming the patterns of the gate electrode, the source electrode, the drain electrode, the semiconductor layer, the gate electrode insulating layer, the first metal barrier layer and the second metal barrier layer comprises: forming the patterns of the source electrode, the drain electrode and the second metal barrier layer on the substrate by one patterning process; forming the pattern of the semiconductor layer on the substrate, on which the patterns of the source electrode, the drain electrode and the second metal barrier layer are formed, by a patterning process; forming the pattern of the first metal barrier layer on the substrate, on which the pattern of the semiconductor layer is formed, by a patterning process; forming the pattern of the gate electrode insulating layer on the substrate, on which the pattern of the first metal barrier layer is formed, by a patterning process; and forming the pattern of the gate electrode on the substrate, on which the pattern of the gate electrode insulating layer is formed, by a patterning process.

For example, preferably, the source electrode and the drain electrode are made of copper or copper alloy.

For example, preferably, the process of forming the patterns of the source electrode, the drain electrode and the second metal barrier layer on the substrate, on which the pattern of the etching barrier layer is formed, by one patterning process comprises: forming a copper film layer or a copper alloy film layer on the substrate, on which the pattern of the etching barrier layer is formed, by a film coating process; introducing oxygen, nitrogen or a mixed gas of oxygen and nitrogen of a predetermined ratio into a cavity, in an initial period of forming of the copper film layer or the copper alloy film layer, to form oxide, nitride or oxynitride of copper or copper alloy so as to form the second metal barrier layer, and forming the source electrode and the drain electrode by the copper film layer or the copper alloy film layer except the portion for the second metal barrier layer; and forming the patterns of the source electrode, the drain electrode and the second metal barrier layer by one exposure, development, photolithography and etching process.

Or, the process of forming the patterns of the source electrode, the drain electrode and the second metal barrier layer on the substrate, on which the pattern of the first metal barrier layer is formed, by one patterning process comprises: forming a copper film layer or a copper alloy film layer on the substrate, on which the pattern of the first metal barrier layer is formed, by a film coating process; introducing oxygen, nitrogen or a mixed gas of oxygen and nitrogen of a predetermined ratio into a cavity, in an initial period of forming of the copper film layer or the copper alloy film layer, to form oxide, nitride or oxynitride of copper or copper alloy so as to form the second metal barrier layer, and forming the source electrode and the drain electrode by the copper film layer or the copper alloy film layer except the portion for the second metal barrier layer; and forming the patterns of the source electrode, the drain electrode and the second metal barrier layer by one exposure, development, photolithography and etching process.

For example, preferably, the process of forming the patterns of the source electrode, the drain electrode and the second metal barrier layer on the substrate by one patterning process comprises: forming a copper film layer or a copper alloy film layer on the substrate by a film coating process; introducing oxygen, nitrogen or a mixed gas of oxygen and nitrogen of a predetermined ratio into a cavity, in an ending period of forming of the copper film layer or the copper alloy film layer, to form oxide, nitride or oxynitride of copper or copper alloy so as to form the second metal barrier layer, and forming the source electrode and the drain electrode by the copper film layer or the copper alloy film layer except the portion for the second metal barrier layer; and forming the patterns of the source electrode, the drain electrode and the second metal barrier layer by one exposure, development, photolithography and etching process.

A barrier layer provided by an embodiment of the invention for an array substrate which is provided the first metal barrier layer only for preventing the diffusion of copper or copper alloy in the array substrate.

For example, preferably, the barrier layer is made of a metal oxide, metal nitride or metal oxynitride, which has the function to prevent the interdiffusion between the material for forming the source/drain electrodes and the material for forming the gate electrode.

For example, preferably, the metal oxide is indium gallium zinc oxide (IGZO) or copper oxide, which has the function to prevent the interdiffusion between the material for forming the source/drain electrodes and the material for forming the gate electrode.

For example, preferably, the metal nitride is copper nitride, which has the function to prevent the interdiffusion between the material for forming the source/drain electrodes and the material for forming the gate electrode.

For example, preferably, the metal oxynitride is copper oxynitride, which has the function to prevent the interdiffusion between the material for forming the source/drain electrodes and the material for forming the gate electrode.

A barrier layer provided by an embodiment of the invention for an array substrate which is provided with both the first metal barrier layer and the second metal barrier layer for preventing the diffusion of copper or copper alloy in the array substrate.

For example, preferably, the barrier layer is made of a metal oxide, metal nitride or metal oxynitride, which has the function to prevent the interdiffusion between the material for forming the source/drain electrodes and the material for forming the gate electrode.

For example, preferably, the metal oxide is IGZO or copper oxide, which has the function to prevent the interdiffusion between the material for forming the source/drain electrodes and the material for forming the gate electrode.

For example, preferably, the metal nitride is copper nitride, which has the function to prevent the interdiffusion between the material for forming the source/drain electrodes and the material for forming the gate electrode.

For example, preferably, the metal oxynitride is copper oxynitride, which has the function to prevent the interdiffusion between the material for forming the source/drain electrodes and the material for forming the gate electrode.

In the TFT provided by the embodiment of the present invention, a first metal barrier layer is disposed between source/drain electrodes and a gate electrode insulating layer and configured to prevent the interdiffusion of materials for forming the source/drain electrodes and materials for forming a gate electrode, so as to improve the performances of the TFT and image quality. Moreover, a second metal barrier layer is disposed between the source/drain electrodes and the first metal barrier layer and configured to further prevent the interdiffusion between the material for forming the source/drain electrodes and the material for fondling the gate electrode, so as to improve the performances of the TFT and image quality.

DETAILED DESCRIPTION

Figure 1:
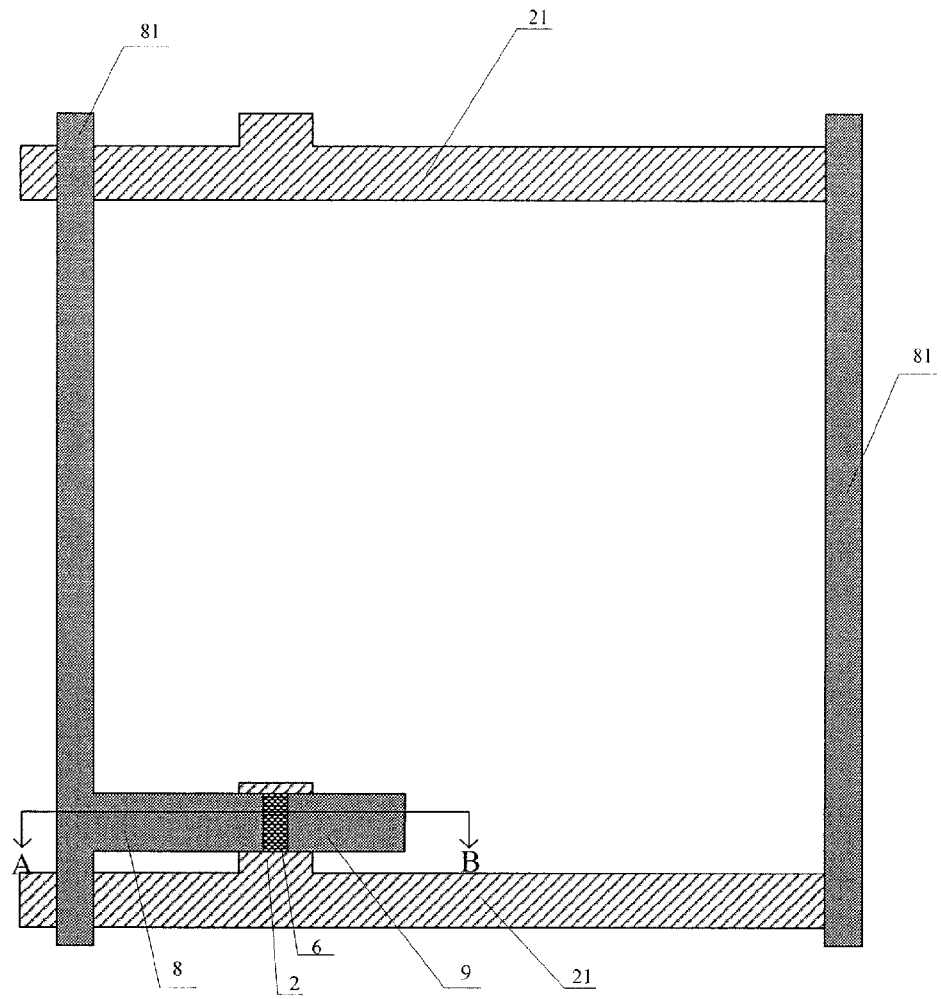
FIG. 1 is a schematic structural top view of an array substrate provided by embodiment 1 of the present invention.

Embodiments of the present invention provide a thin film transistor (TFT), a manufacturing method thereof, an array substrate, a display device and a barrier layer. The present invention is used for improving the performances of the TFT and hence improving image quality.

In general, a TFT at least comprises a gate electrode, a source electrode, a drain electrode and a semiconductor layer, which are disposed on a substrate, and a gate electrode insulating layer disposed between the gate electrode and the semiconductor layer. The source electrode and the drain electrode may be collectively referred to as a source/drain electrode layer, and the film layer of the TFT, in which the source/drain electrode layer is provided, is referred to as an SD layer. Moreover, the TFT further comprises an etching barrier layer disposed between the semiconductor layer and the source/drain electrodes. Generally, an etching barrier layer is not required to be disposed for an amorphous silicon TFT and a polysilicon TFT. As for a metal oxide TFT, in order to prevent the etching for the patterns of the source/drain electrodes from affecting the semiconductor layer made of a metal oxide, the etching barrier layer may be arranged. But there may be also the case that the semiconductor layer is made of a certain type of metal oxides and at the same time the etching barrier layer is not required. Furthermore, the TFT provided by the embodiment of the present invention further comprises a barrier layer disposed between the source/drain electrodes and the gate electrode insulating layer and configured to prevent the interdiffusion between the material for forming the source/drain electrodes and the material for forming the gate electrode, and the barrier layer is a first metal barrier layer which is configured to prevent the interdiffusion between the material for forming the source/drain electrodes and the material for forming the gate electrode, so as to improve the performances of the TFT and image quality.

At least one of the source electrode, the drain electrode and the gate electrode in the TFT provided by an embodiment of the present invention is made of copper or copper alloy of low resistivity. Of course, the present invention is not limited thereto, and the objective of the embodiment of the present invention is to adopt the first metal barrier layer to prevent the interdiffusion between the material for forming the source/drain electrodes and the material for forming the gate electrode. In addition, other materials for forming the gate electrode, the source electrode and the drain electrode, which have high diffusibility, are also applicable to the present invention, for instance, gold and silver.

The TFT provided by the embodiment of the present invention will be simply described below.

Based on the case whether the TFT is provided with an etching barrier layer, the TFT is divided into two types:

The first type of TFT, on a substrate, comprises a gate electrode, a source electrode, a drain electrode and a semiconductor layer, a gate electrode insulating layer disposed between the gate electrode and the semiconductor layer, an etching barrier layer disposed between the semiconductor layer and the source/drain electrodes, and a first metal barrier layer disposed between the source/drain electrode layer and the gate electrode insulating layer, in which the first metal barrier layer is arranged on the same layer as the semiconductor layer and configured to prevent the interdiffusion between the material for forming the source/drain electrodes and the material for forming the gate electrode.

It should be noted that the "source/drain electrodes" refer to the source electrode and the drain electrode arranged on the same layer and may also be collectively referred to as the source/drain electrode layer. That is to say, both the "source/drain electrodes" and the "source/drain electrode layer" mentioned in the present invention refer to the source electrode and the drain electrode arranged on the same layer. The source electrode and the drain electrode arranged on the same layer are referred to as the source/drain electrode layer.

The second type of TFT, on a substrate, comprises a gate electrode, a source electrode, a drain electrode and a semiconductor layer, a gate electrode insulating layer disposed between the gate electrode and the semiconductor layer, and a first metal barrier layer disposed between the gate electrode insulating layer and the source/drain electrodes, in which the first metal barrier layer is disposed between the source/drain electrodes and the gate electrode insulating layer, and the first metal barrier layer is arranged on the same layer as the semiconductor layer and configured to prevent the interdiffusion between the material for forming the source/drain electrodes and the material for forming the gate electrode.

The first metal barrier layer in the two types of TFTs provided by the present invention is configured to prevent the material for forming the source/drain electrodes from being diffused to the gate electrode insulating layer and/or the gate electrode, and to prevent the material for forming the gate electrode from being diffused to the semiconductor layer and/or the source/drain electrode layer.

In order to further prevent the interdiffusion between the material for forming the source/drain electrodes and the material for forming the gate electrode in the two types of TFTs provided by the present invention, for instance, preferably, a second metal barrier layer is provided between the first metal barrier layer and the source/drain electrode layer. The second metal barrier layer not only can prevent the material for forming the source/drain electrodes and the material for forming the gate electrode from being diffused to the semiconductor layer but also can prevent the material for forming the source/drain electrodes from being diffused to the gate electrode insulating layer and the gate electrode.

One preferred embodiment of the first type of TFT is as follows: the TFT comprises a substrate, and a gate electrode, a source/drain electrode layer and a semiconductor layer which are formed on the substrate, a gate electrode insulating layer formed on the substrate and disposed between the gate electrode and the semiconductor layer, an etching barrier layer disposed between the semiconductor layer and the source/drain electrode layer, and a first metal barrier layer disposed between the source/drain electrode layer and the gate electrode insulating layer, in which the first metal barrier layer is arranged on the same layer as and insulated from the semiconductor layer.

The source electrode and the drain electrode are made of copper. In order to prevent copper ions from being diffused to the gate electrode insulating layer and the gate electrode to contaminate the gate electrode and the gate electrode insulating layer and hence reduce the performances of the TFT, the first metal barrier layer is formed between the source/drain electrode layer and the gate electrode insulating layer to prevent the diffusion of the metal ions in the source/drain electrode layer.

In order to prevent the metal copper ions in the source/drain electrode layers from being diffused to the semiconductor layer, a barrier layer having the function of preventing the interdiffusion of the material for forming the source/drain electrodes and the material for forming the gate electrode is disposed between the semiconductor layer and the source/drain electrode layer. The barrier layer is a second metal barrier layer which not only can prevent the materials for forming the source/drain electrode layer from being diffused to the semiconductor layer but also can further prevent the metallic copper ions from being diffused to the gate electrode insulating layer and the gate electrode.

Detailed description will be given below for the TFT, the manufacturing method thereof, the array substrate, the display device and the barrier layer provided by the present invention with reference to the accompanying drawings and different embodiments.

The TFT provided by the embodiment of the present invention may be a bottom-gate TFT or a top-gate TFT. Detailed description will be given below to the bottom-gate TFT and the top-gate TFT provided by the embodiments of the present invention with reference to the accompanying drawings.

Embodiment 1

Corresponding to the First Type of TFT

The structure of the bottom-gate TFT provided by embodiment 1 is as follows: the gate electrode is disposed on the substrate; the gate electrode insulating layer is disposed on the gate electrode; the semiconductor layer and the first metal barrier layer are disposed on the gate electrode insulating layer; the etching barrier layer is disposed on the semiconductor layer; and the source electrode and the drain electrode are disposed on the etching barrier layer.

The structure of the top-gate TFT provided by embodiment 1 is as follows: the source electrode and the drain electrode are disposed on the substrate; the etching barrier layer is disposed on the source electrode and the drain electrode; the semiconductor layer and the first metal barrier layer are disposed on the etching barrier layer; the gate electrode insulating layer is disposed on the semiconductor layer and the first metal barrier layer; and the gate electrode is disposed on the gate electrode insulating layer.

The semiconductor layer and the first metal barrier layer may be arranged on the same layer or may be arranged on different layers. In order to reduce the overall thickness of the TFT as much as possible, for instance, preferably, the semiconductor layer and the first metal barrier layer are arranged on the same layer.

It should be noted that: unless otherwise specified, the vertical positional relationship between various film layers in the structure of all the TFTs provided by the present invention only refers to that the film layers are disposed on the same layer or disposed on different layers and does not refers to the specific structures of the film layers and the specific relative positions of the film layers with other film layers. For instance, "the etching barrier layer is disposed on the source electrode and the drain electrode" only refers to that the etching barrier layer is arranged on different layers with the source electrode and the drain electrode, and the etching barrier layer is disposed on the source electrode and the drain electrode with respect to the substrate, and that is the etching barrier layer is far away from the substrate compared with the source electrode and the drain electrode.

For instance, preferably, the first metal barrier layer is provided isolated from or not isolated from the semiconductor layer.

In the embodiment, the semiconductor layer is not isolated from the first metal barrier layer.

Moreover, at least one of the material for forming the source/drain electrodes and the material for forming the gate electrode is copper or copper alloy of low resistivity.

Figure 2:
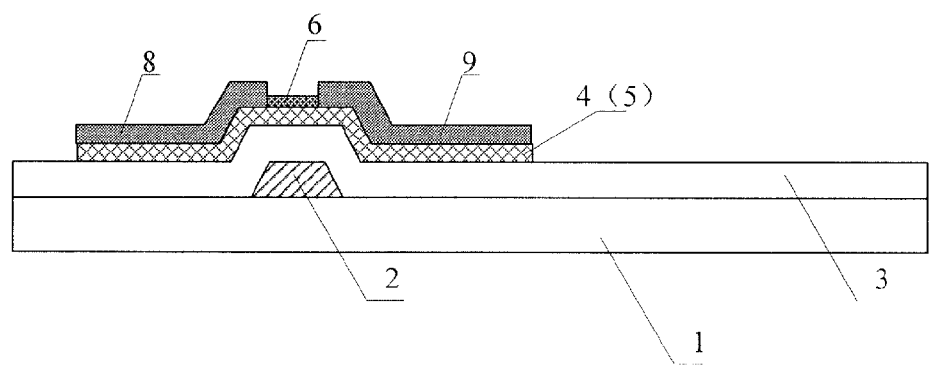
FIG. 2 is a sectional view of a TFT as shown in FIG. 1 in the A-B direction.

Detailed description will be given below with reference to the accompanying drawings. FIG. 1 is a top view of an array substrate, comprising a TFT, provided by embodiment 1, and FIG. 2 is a sectional view of the TFT as shown in FIG. 1 in the A-B direction.

The TFT as shown in FIG. 1 comprises a gate electrode 2, a source electrode 8, a drain electrode 9, an etching barrier layer 6 and a semiconductor layer. The array substrate as shown in FIG. 1 further comprises a data line 81 connected with the source electrode 8 and a gate line 21 connected with the gate electrode 2. The source electrode 8 and the drain electrode 9 may be collectively referred to as the source/drain electrode layer, and a film layer of the TFT, in which the source/drain electrode layer is disposed, is referred to as an SD layer.

Description will be given below by taking a bottom-gate TFT as an example. The bottom-gate TFT as shown in FIG. 2 comprises: a substrate 1; a gate electrode 2 formed on the substrate 2; a gate electrode insulating layer 3 formed on the substrate and disposed on the gate electrode 2; a semiconductor layer 4 and a first metal barrier layer 5 formed on the substrate and disposed on the gate electrode insulating layer 3, in which the semiconductor layer 4 and the first metal barrier layer 5 are arranged on the same layer; an etching barrier layer 6 formed on the substrate and disposed on the semiconductor layer 4, in which the etching barrier layer 6 is disposed on a channel of the semiconductor layer 4 and configured to protect the channel from being affected during the etching; and a source electrode 8 and a drain electrode 9 formed on the substrate 1 and disposed on the first metal barrier layer 5.

As the first metal barrier layer is disposed between the source/drain electrode layer (the SD layer) and the gate electrode insulating layer 3, metal ions in the source/drain electrode layer are prevented from entering the gate electrode insulating layer and the gate electrode layer. Similarly, metal ions in the gate electrode layer are also prevented from entering the semiconductor layer and the source/drain electrode layer, and hence the performances of the TFT can be improved.

In the TFT as shown in FIG. 2, preferably, the semiconductor layer 4 and the first metal barrier layer 5 are arranged on the same layer. In addition, the semiconductor layer 4 and the first metal barrier layer 5 may be also arranged on different layers, which will not be specifically limited herein.

For instance, preferably, at least one of the material for forming the source/drain electrodes and the material for forming the gate electrode is copper or copper alloy.

When at least one of the material for forming the source/drain electrodes and the material for forming the gate electrode is copper or copper alloy, in order to further prevent the interdiffusion between the material for forming the source/drain electrodes and the material for forming the gate electrode, for instance, preferably, the TFT provided by embodiment 1 further comprises: a second metal barrier layer disposed between the first metal barrier layer and the source/drain electrodes and configured to prevent the interdiffusion between the material for forming the source/drain electrodes and the material for forming the gate electrode.

For instance, the structure of the bottom-gate TFT is as follows: the gate electrode is disposed on the substrate; the gate electrode insulating layer is disposed on the gate electrode; the semiconductor layer and the first metal barrier layer are disposed on the gate electrode insulating layer; the etching barrier layer is disposed on the semiconductor layer; the second metal barrier layer is disposed on the semiconductor layer and the first metal barrier layer; and the source/drain electrode layer is disposed on the second metal barrier layer.

The structure of the top-gate TFT is as follows: the source/drain electrode layer is disposed on the substrate; the second metal barrier layer is disposed on the source/drain electrode layer; the etching barrier layer is disposed on the second metal barrier layer; the semiconductor layer and the first metal barrier layer are disposed on the etching barrier layer; the gate electrode insulating layer is disposed on the semiconductor layer; and the gate electrode is disposed on the gate electrode insulating layer.

Figure 3:
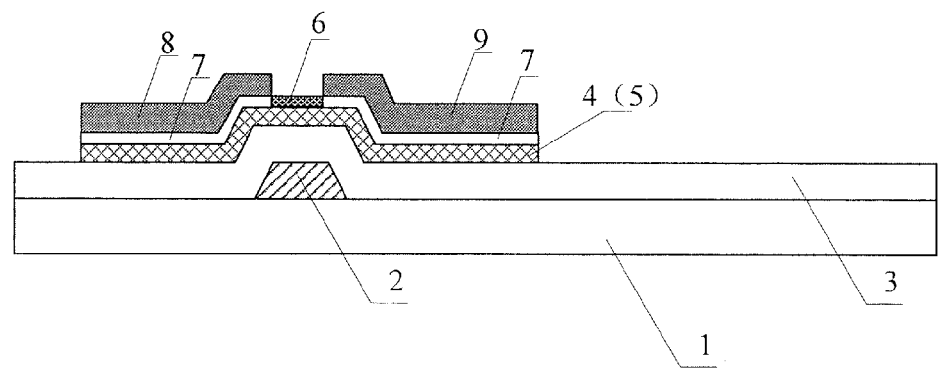
FIG. 3 is a schematic structural view of a TFT having a second metal barrier layer as shown in FIG. 2.

Detailed description will be given below with the accompanying drawing. As illustrated in FIG. 3, the TFT provided by embodiment 1 further comprises: a second metal barrier layer 7 disposed between the source/drain electrode layer and the first metal barrier layer 5.

The TFT comprises: a gate electrode 2 disposed on a substrate 1; a gate electrode insulating layer 3 disposed on the gate electrode 2; a semiconductor layer 4 and a first metal barrier layer 5 disposed on the gate electrode insulating layer 3; an etching barrier layer 6 disposed on the semiconductor layer 4; a second metal barrier layer 7 disposed on the semiconductor layer 4 and the first metal barrier layer 5; and a source electrode 8 and a drain electrode 9 disposed on the second metal barrier layer 7.

In the TFT as shown in FIG. 3, the second metal barrier layer 7 is disposed between the source/drain electrode layer and the first metal barrier layer 5, and further prevents metal ions in the SD layer from being diffused to the gate electrode insulating layer and/or the gate electrode and further improves the performances of the TFT.

In the TFT as shown in FIGS. 2 and 3, at least one of the source/drain electrode layer and the gate electrode is made of metallic copper (Cu) or copper alloy. For instance, preferably, the material for forming the source/drain electrodes is copper or copper alloy.

For instance, preferably, the gate electrode may be made of a metal such as copper (Cu), chromium (Cr), tungsten (W), titanium (Ti), tantalum (Ta) and molybdenum (Mo) or a metal alloy formed by at least two metals taken from the above group.

The source electrode and the drain electrode are made of copper. In order to prevent copper ions from being diffused to the gate electrode insulating layer and the gate electrode to contaminate the gate electrode and the gate electrode insulating layer and hence reduce the performances of the TFT, the first metal barrier layer is formed between the source/drain electrode layer and the gate electrode insulating layer in the present invention to prevent the diffusion of the metal ions in the source/drain electrode layer.

In order to prevent the metallic copper ions in the source/drain electrode layer from being diffused to the semiconductor layer, the second metal barrier layer is disposed between the semiconductor layer and the source/drain electrode layer. The second metal barrier layer not only can prevent the metallic copper ions from being diffused to the semiconductor layer but also can further prevent the metallic copper ions from being diffused to the gate electrode insulating layer and the gate electrode.

The first metal barrier layer and the semiconductor layer, arranged on the same layer, in any of the above-described types of TFT, may be made of the same material or different materials.

For instance, preferably, the semiconductor layer is a metal oxide semiconductor layer.

The first metal barrier layer is made of a metal oxide semiconductor material.

Moreover, the first metal barrier layer is made of the same material as the semiconductor layer.

For instance, the first metal barrier layer and the semiconductor layer which are arranged on the same layer are made of the same material. The first metal barrier layer may be made of a material for preparing the metal oxide semiconductor layer. For instance, the material may be indium gallium zinc oxide (IGZO), hafnium indium zinc oxide (HIZO), indium zinc oxide (IZO), amorphous indium zinc oxide (a-InZnO), amorphous fluorine-doped zinc oxide (ZnO:F), tin-doped indium oxide (In2O3:Sn), amorphous molybdenum-doped indium oxide (In2O3:Mo), cadmium tin oxide (Cd2SnO4), amorphous aluminum-doped zinc oxide (ZnO:Al), amorphous niobium-doped titanium oxide (TiO2:Nb), cadmium tin oxide (Cd—Sn—O) or other metal oxides. The first metal barrier layer and the semiconductor layer arranged on the same layer may be made of the same material, and therefore the first metal barrier layer and the semiconductor layer belong to the same film layer and are formed by same one patterning process during implementation. Compared with the traditional method for manufacturing a TFT, no extra process is added.

As for the case that the first metal barrier layer and the semiconductor layer arranged on the same layer are made of different materials, for instance, preferably, the first metal barrier layer may be made of copper oxide (CuOx), copper nitride (CuNy), copper oxynitride (CuNyOx) or the like; or, for instance, preferably, the first metal barrier layer is made of a metal oxide semiconductor material different from that of the semiconductor layer.

In the TFT provided by above two preferred embodiments (corresponding to the TFT as shown in FIGS. 2 and 3), the first metal barrier layer and the semiconductor layer arranged on the same layer may be insulated or not insulated from each other as long as the functions of the TFT are not affected, which will not be limited herein. The insulation arrangement method may be variable. For instance, the first metal barrier layer and the semiconductor layer are insulated from each other by laser cutting, a doping process or a patterning process directly.

When the first metal barrier layer and the semiconductor layer arranged on the same layer are made of the same material, and the semiconductor layer is insulated from the first metal barrier layer, the semiconductor layer and the first metal barrier layer formed on the same layer may be insulated from each other by laser cutting, a doping process or a patterning process directly. Of course, the specific forming method is not limited as long as the semiconductor layer and the first metal barrier layer are maintained to be insulated from each other. The insulation arrangement method may be variable. For instance, the first metal barrier layer and the semiconductor layer are insulated from each other by laser cutting, doping process or patterning process directly.

For instance, preferably, the first metal barrier layer and the semiconductor layer arranged on the same layer are made of the same material and not insulated from each other. In a specific implementation process, the semiconductor layer and the first metal barrier layer are formed by the same film by same one patterning process. Compared with the traditional method for manufacturing the TFT, no extra process is added.

For instance, preferably, in the TFT as shown in FIGS. 2 and 3, at least one of the source/drain electrode layer and the gate electrode is made of metallic copper (Cu) or copper alloy. For instance, preferably, the material for forming the source electrode and the drain electrode is copper or copper alloy.

For instance, preferably, the gate electrode may be made of a metal such as copper (Cu), chromium (Cr), tungsten (W), titanium (Ti), tantalum (Ta) and molybdenum (Mo) or a metal alloy formed by at least two metals taken from the above group.

Moreover, the second metal barrier layer may be made of copper oxide (CuOx), copper nitride (CuNy), copper oxynitride (CuNyOx) or the like; or, the second metal barrier layer is made of a metal oxide semiconductor material. For instance, the material may be indium gallium zinc oxide (IGZO), hafnium indium zinc oxide (HIZO), indium zinc oxide (IZO), amorphous indium zinc oxide (a-InZnO), amorphous fluorine-doped zinc oxide (ZnO:F), tin-doped indium oxide (In2O3:Sn), amorphous molybdenum-doped indium oxide (In2O3:Mo), cadmium tin oxide (Cd2SnO4), amorphous aluminum-doped zinc oxide (ZnO:Al), amorphous niobium-doped titanium oxide (TiO2:Nb), cadmium tin oxide (Cd—Sn—O) or other metal oxides.

In any of the above-mentioned types of TFT, at least one of the source electrode, the drain electrode and the gate electrode is made of copper or copper alloy of low resistivity. For instance, preferably, the source/drain electrode layer is made of metallic copper or copper alloy, and the second metal barrier layer is made of copper oxide (CuOx), copper nitride (CuNy), copper oxynitride (CuNyOx) or the like. In an implementation process, the second metal barrier layer and the SD layer may be formed by same one patterning process. It should be understood that the forming method of the second metal barrier layer and the SD layer is not limited thereto.

Firstly, the copper oxide (CuOx), the copper nitride (CuNy) or the copper oxynitride (CuNyOx) can form a stable interface with the semiconductor layer and the first metal barrier layer. Secondly, the etching properties of the copper oxide (CuOx), the copper nitride (CuNy) or the copper oxynitride (CuNyOx) are similar to those of the source/drain electrode layer made of metallic copper or copper alloy. When wet etching is performed on both the source/drain electrode layer and the first metal barrier layer under the source/drain electrode layer at the same time, as the second metal barrier layer (the copper oxide (CuOx), the copper nitride (CuNy) or the copper oxynitride (CuNyOx)) is disposed between the source/drain electrode layer and the first metal barrier layer, the problem that the wet etching is very difficult or the morphology of a cross section formed by wet etching is poor in the case where the metallic copper or the copper alloy is directly combined with the first metal barrier layer can be solved.

In any of the above-mentioned types of TFT, in order to better prevent the interdiffusion between the material for forming the source/drain electrodes and the material for forming the gate electrode, the projection area of the first metal barrier layer on the substrate should at least completely cover the projection area of the source/drain electrode layer on the substrate as long as the mutual positional relationship does not affect the performances of the TFT.

In order to better prevent the interdiffusion between the material for forming the source/drain electrodes and the material for forming the gate electrode, in the above embodiment of the present invention, the projection area of the second metal barrier layer on the substrate should at least completely cover the projection area of the source/drain electrode layer on the substrate, and the specific position is not limited as long as the functions of the TFT are not affected.

In the embodiment of the present invention, the projection area and the mutual position relationship of the first metal barrier layer and the second metal barrier layer on the substrate are not limited as long as the functions of the TFT are not affected.

For instance, preferably, in order to improve the performances of the TFT, the gate electrode insulating layer can be further divided into two layers: one layer is a silicon nitride (SiNx) layer making contact with the gate electrode and the other layer is a silicon oxide (SiOx) layer making direct contact with the semiconductor layer and the first metal barrier layer. The design of the dual-layered insulating layer can prevent the diffusion of the metal ions in the electrodes of the TFT on one hand, and can avoid the introduction of outside impurities such as water and oxygen and hence improve the performances of the TFT on the other hand.

For instance, preferably, in order to improve the electric conductivity of the semiconductor layer, any of the above-mentioned types of TFT further comprises: a first ohmic contact layer and a second ohmic contact layer which are respectively disposed on the upper side and the lower side of the semiconductor layer. The first ohmic contact layer is disposed between the gate electrode insulating layer and the semiconductor layer, and the second ohmic contact layer is disposed between the semiconductor layer and the source/drain electrodes. The first ohmic contact layer and the second ohmic contact layer may be doped semiconductor layers of better electric conductivity.

For instance, preferably, the substrate provided by the embodiment of the present invention may be made of glass, quartz or flexible plastics.

It should be noted that the structure of the lead area in the periphery around a display area is not particularly specified in the exemplified structure of the present invention, and various film layers are formed in the periphery at the same time when the display area is formed. In addition, the sequence of the film layers in the display area may be variable as long as the components (such as a gate electrode, a source electrode, a drain electrode and a pixel electrode) required for the driving of a panel are manufactured to ensure that the panel can be normally driven. Therefore, the film layer structures in the peripheral are correspondingly variable. For instance, the gate electrode is not necessarily directly formed on the substrate and another film layer may be disposed under the gate electrode. In order to improve the adhesiveness of the substrate and the metal film layer on the substrate, a buffer layer may be also disposed between the substrate and the gate electrode. The buffer layer may be an indium tin oxide (ITO) film layer or an indium zinc oxide (IZO) film layer. For instance, the insulating layer is not necessarily further divided into two layers, and more than one insulating layer may be disposed between the gate electrode and the semiconductor layer. The structure of the embodiment of the present invention only needs to ensure that the metal layers are insulated from each other and conductive members (such as connecting electrodes made of ITO materials) connected to the outside are provided.

Description is given above to embodiment 1 by taking the bottom-gate TFT as an example. Simple description will be given below to the top-gate TFT provided by embodiment 1 of the present invention.

The structure of the top-gate TFT is similar to that of any type of the above bottom-gate TFT provided by embodiment 1. That is to say, the first metal barrier layer, the second metal barrier layer, the gate electrode insulating layer, the substrate, the ohmic contact layer(s), the buffer layer and relevant technical characteristics in the TFT provided above in embodiment 1 are applicable to the top-gate TFT. The difference is that the relative positions between the source electrode, the drain electrode, the gate electrode, the gate electrode insulating layer and the semiconductor layer and the substrate are changed. A buffer layer is disposed between the substrate and the source/drain electrode layer, and a buffer layer is also disposed between partial semiconductor structure and the substrate. In the top-gate TFT provided by the embodiment of the present invention, other descriptions are applicable except that the structure of the TFT is different from that of the bottom-gate TFT.

Embodiment 2

Corresponding to One Example of Embodiment 1, i.e., Corresponding to One Example of the First Type of TFT Description will be given below by taking a bottom-gate TFT as an example.

Figure 4:
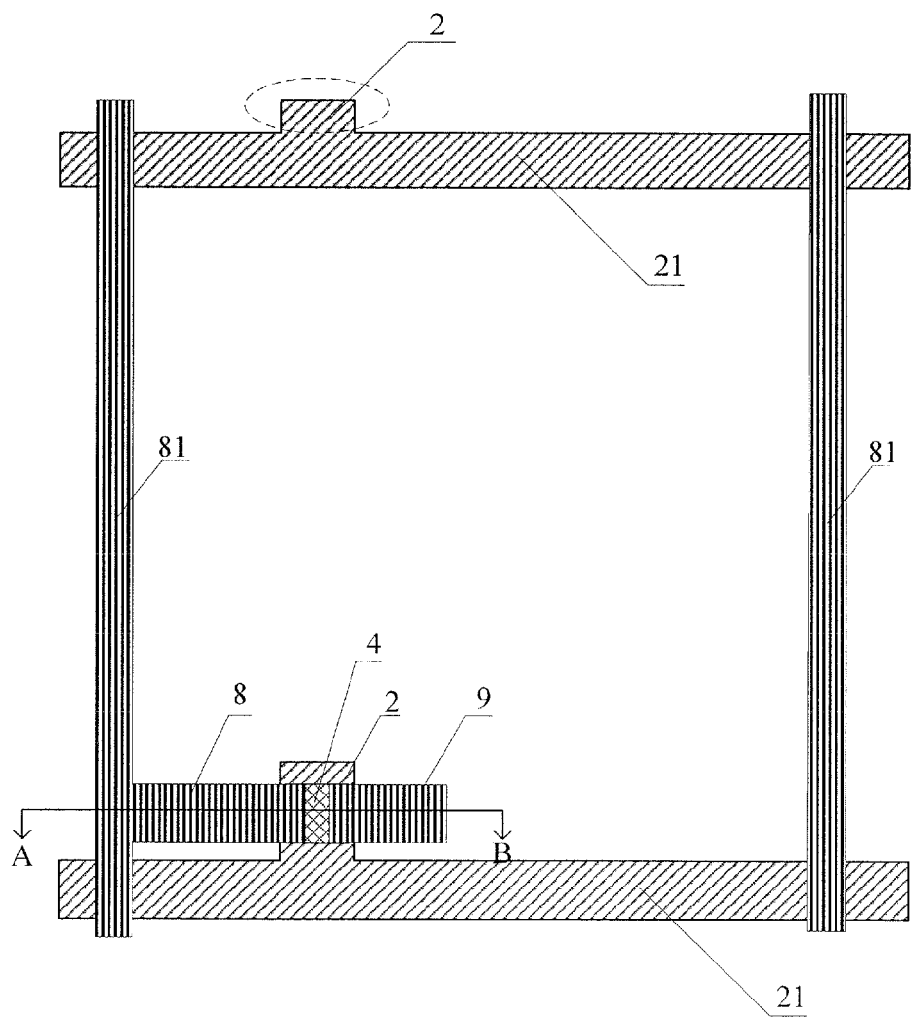
FIG. 4 is a schematic structural top view of an array substrate provided by embodiment 2 of the present invention.
Figure 5:
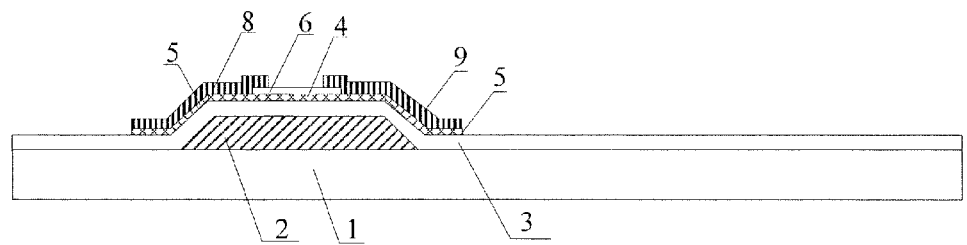
FIG. 5 is a sectional view of a TFT as shown in FIG. 4 in the A-B direction.

FIG. 4 is a top view of the TFT, and FIG. 5 is a sectional view of the TFT as shown in FIG. 4 in the A-B direction.

The TFT provided by embodiment 1 comprises a gate electrode 2 (the structure represented by dotted lines in FIG. 4), a gate line 21, a source electrode 8 and a drain electrode 9 connected with the gate electrode 2, a data line 81 connected with the source electrode 8, and a semiconductor layer 4.

The source electrode 8 and the drain electrode 9 may be collectively referred to as a source/drain electrode layer, and a film layer of the TFT, in which the source/drain electrode layer is disposed, is referred to as an SD layer.

As illustrated in FIG. 5, the TFT provided by the embodiment of the present invention comprises: a substrate 1; a gate electrode 2 formed on the substrate; a gate electrode insulating layer 3 formed on the substrate 1 and disposed on the gate electrode 2; a semiconductor layer 4 and a first metal barrier layer 5 formed on the substrate 1 and disposed on the gate electrode insulating layer 3; an etching barrier layer 6 formed on the substrate 1 and disposed on the semiconductor layer 4 and the first metal barrier layer 5, in which the etching barrier layer 6 is disposed on the semiconductor layer 4; and a source electrode 8 and a drain electrode 9 formed on the substrate 1 and disposed on the etching barrier layer 6.

For instance, preferably, at least one of the material for forming the source/drain electrodes and the material for forming the gate electrode is copper or copper alloy.

For instance, preferably, as illustrated in FIG. 5, the first metal barrier layer 5 is disposed at a position corresponding to the source/drain electrode layer (i.e., the source electrode 8 and the drain electrode 9). That is to say, a vertical projection of the source/drain electrode layer is in the first metal barrier layer 5 and the semiconductor layer 4 so as to ensure that metal ions in the source/drain electrode layer cannot be diffused to the gate electrode insulating layer 3 and the gate electrode 2 which are disposed under the first metal barrier layer 5.

For instance, preferably, the first metal barrier layer 5 as shown in FIG. 5 is made of the same material as the semiconductor layer 4.

In an implementation process, the semiconductor layer 4 and the first metal barrier layer 5 are formed by the same film by same one patterning process. Compared with the traditional method for manufacturing the TFT, no extra process is added. In addition, the semiconductor layer 4 and the first metal barrier layer 5 are insulated from each other. A certain gap may be formed between the semiconductor layer 4 and the first metal barrier layer 5 formed on the same layer by a patterning process. Of course, the specific forming method is not limited as long as the semiconductor layer 4 and the first metal barrier layer 5 are kept to be insulated from each other.

The semiconductor layer may be made of a metal oxide. For instance, the metal oxide may be indium gallium zinc oxide (IGZO), hafnium indium zinc oxide (HIZO), indium zinc oxide (IZO), amorphous indium zinc oxide (a-InZnO), amorphous fluorine-doped zinc oxide (ZnO:F), tin-doped indium oxide (In2O3:Sn), amorphous molybdenum-doped indium oxide (In2O3:Mo), cadmium tin oxide (Cd2SnO4), amorphous aluminum-doped zinc oxide (ZnO:Al), amorphous niobium-doped titanium oxide (TiO2:Nb), cadmium tin oxide (Cd—Sn—O) or other metal oxides.

The first metal barrier layer of the present invention is a metal oxide film layer which can effectively block metal ions and hence improve the performances of the TFT.

In the TFT as shown in FIGS. 4 and 5, the first metal barrier layer 5 is disposed between the source/drain electrode layer (the SD layer) and the gate electrode insulating layer 3 to prevent metal ions in the source/drain electrode layer from entering the gate electrode insulating layer and the gate electrode layer. Similarly, the first metal barrier layer 5 also prevents metal ions in the gate electrode layer from entering the semiconductor layer and the source/drain electrode layer and hence improves the performances of the TFT.

Figure 6:
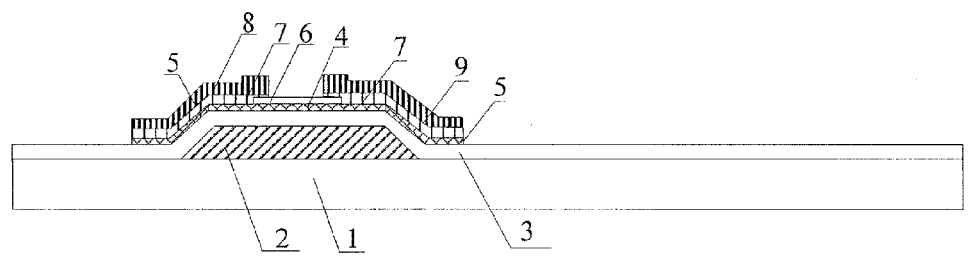
FIG. 6 is a schematic structural view of a TFT having a second metal barrier layer as shown in FIG. 5.

For instance, preferably, as illustrated in FIG. 6, the TFT provided by the embodiment of the present invention further comprises: a second metal barrier layer 7 disposed between the source/drain electrode layer and the first metal barrier layer 5.

For instance, preferably, the second metal barrier layer 7 is disposed at a position corresponding to the source/drain electrode layer and between the first metal barrier layer 5 and the source/drain electrode layer. For instance, preferably, projections of the first metal barrier layer 5 and the second metal barrier layer 7 in the vertical direction may be overlapped with each other.

In the TFT as shown in FIG. 6, the second metal barrier layer 7 is disposed between the source/drain electrode layer and the first metal barrier layer 5 and further prevents metal ions in the SD layer from being diffused to the gate electrode insulating layer or the gate electrode, also prevents metal ions in the gate electrode from being diffused to the semiconductor layer and the SD layer, and hence further improves the performances of the TFT. In an implementation process, the second metal barrier layer and the SD layer are formed by same one patterning process.

For instance, preferably, the second metal barrier layer 7 is made of copper oxide (CuO), copper nitride (CuN), copper oxynitride (CuNO) or the like. The copper oxide (CuO), the copper nitride (CuN) or the copper oxynitride (CuNO) can form a stable interface with the semiconductor layer 4 and the first metal barrier layer 5. When wet etching is performed on the source/drain electrode layer, the data line and the first metal barrier layer 5 disposed under the source/drain electrode layer at the same time, as the second metal barrier layer 7, for instance, the copper oxide (CuO), the copper nitride (CuN) or the copper oxynitride (CuNO), is disposed between the source/drain electrode layer and the first metal barrier layer 5, the problem that the wet etching is very difficult or the morphology of a cross section formed by wet etching is poor in the case where the metallic copper is directly combined with the first metal barrier layer 5 can be solved.

For instance, preferably, in order to improve the performances of the TFT, the gate electrode insulating layer can be further divided into two layers: one layer is a silicon nitride (SiNx) layer making contact with the gate electrode and the other layer is a silicon oxide (SiOx) layer making direct contact with the semiconductor layer and the first metal barrier layer.

For instance, preferably, in order to improve the electric conductivity of the semiconductor layer, the TFT further comprises: a first ohmic contact layer and a second ohmic contact layer which are respectively disposed on the upper side and the lower side of the semiconductor layer. The first ohmic contact layer is disposed between the gate electrode insulating layer and the semiconductor layer, and the second ohmic contact layer is disposed between the semiconductor layer and the source/drain electrodes. The first ohmic contact layer and the second ohmic contact layer may be doped semiconductor layers of better electric conductivity.

For instance, preferably, the substrate provided by the embodiment of the present invention may be made of glass, quartz or flexible plastics.

It should be noted that the structure of a lead area in the periphery around a display area is not particularly specified in the exemplified structure of the present invention, and various film layers are formed in the periphery at the same time when the display area is formed. In addition, the sequence of the film layers in the display area may be variable as long as components (such as a gate electrode, a source electrode, a drain electrode and a pixel electrode) required for the driving of a panel are manufactured to ensure that the panel can be normally driven. Therefore, the peripheral film layer structure is correspondingly variable. For instance, the gate electrode is not necessarily directly formed on the substrate and another film layer may be disposed under the gate electrode. In order to improve the adhesiveness of the substrate and metal film layers on the substrate, a buffer layer may be also disposed between the substrate and the gate electrode. The buffer layer may be an ITO film layer or an IZO film layer. For instance, the insulating layer is not necessarily further divided into two layers, and more than one insulating layer may be disposed between the gate electrode and the semiconductor layer. The structure of the embodiment of the present invention only needs to ensure that various metal layers are insulated from each other and conductive members (such as connecting electrodes made of ITO materials) connected to the outside are provided.

The TFT provided by embodiment 2 is a bottom-gate TFT. Simple description will be given below to a top-gate TFT.

Figure 7:
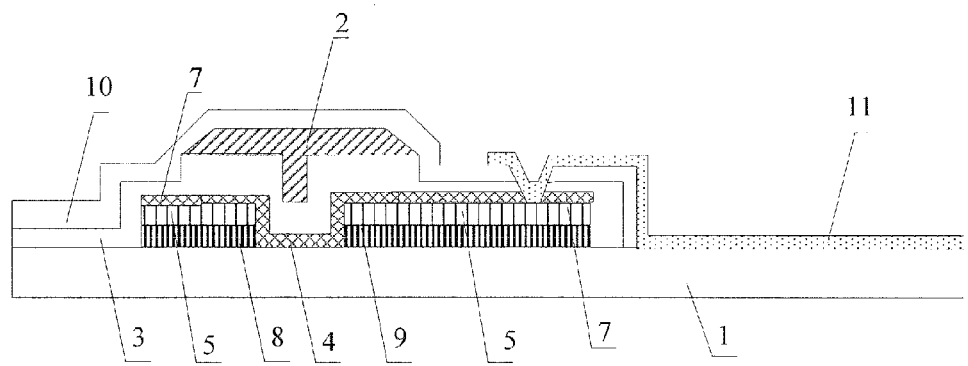
FIG. 7 is a schematic structural view of a TFT provided by embodiment 2.

As illustrated in FIG. 7, the structure is similar to that of the bottom-gate TFT. The difference is that: the positions of the gate electrode and the semiconductor layer are different. The TFT comprises: a substrate 1; a source electrode 8 and a drain electrode 9 formed on the substrate 1; an etching barrier layer 6 formed on the substrate 1 and disposed on the source electrode 8 and the drain electrode 9; a semiconductor layer 4 and a first metal barrier layer 5 formed on the substrate 1 and disposed on the etching barrier layer 6; a gate electrode insulating layer 3 formed on the substrate 1 and disposed on the semiconductor layer 4 and the first metal barrier layer 5; and a gate electrode 2 formed on the substrate 1 and disposed on the gate electrode insulating layer 3.

The etching barrier layer actually has the function of protecting the source electrode and the drain electrode from being affected by etching.

For instance, preferably, the TFT further comprises: a second metal barrier layer 7 formed between the first metal barrier layer 5 and the source electrode 8 and the drain electrode 9.

For instance, preferably, the TFT further comprises: a passivation layer 10 formed on the gate electrode 2 and configured to cover the whole TFT.

Similar to embodiment 1, an array substrate comprising the top-gate TFT further comprises a pixel electrode 11.

The pixel electrode 11 is connected with the drain electrode 9 of the TFT via a through hole.

Other structures are similar to those of the bottom-gate TFT array substrate and will not be further described herein.

Embodiment 3

The Second Type of TFT (at Least Including an Amorphous Silicon TFT or a Polysilicon TFT)

The second type of TFT provided by embodiment 3 is similar to the TFT provided by embodiment 1, for instance, the relevant technical characteristics such as the material and the setting position of film layers such as the first metal barrier layer, the second metal barrier layer, the gate electrode insulating layer, the substrate, the ohmic contact layers and the buffer layer provided by embodiment 1 are all applicable to the second type of TFT provided by embodiment 3. The differences are as follows:

(1) The material of the semiconductor layer is different, in which the semiconductor layer of the amorphous silicon TFT or the polysilicon TFT is made of amorphous silicon or polysilicon.

(2) The etching barrier layer is not arranged.

(3) The first metal barrier layer and the semiconductor layer are made of different materials.

Simple description will be given below to the structure of the TFT provided by embodiment 3.

For instance, preferably, as for a bottom-gate TFT which is provided with the first metal barrier layer only, the structure is as follows: the gate electrode is disposed on the substrate; the gate electrode insulating layer is disposed on the gate electrode; the semiconductor layer and the first metal barrier layer are disposed on the gate electrode insulating layer; and the source electrode and the drain electrode are disposed on the first metal barrier layer.

For instance, preferably, as for a top-gate TFT which is provided with the first metal barrier layer only, the structure is as follows: the source electrode and the drain electrode are disposed on the substrate; the semiconductor layer and the first metal barrier layer are disposed on the source electrode and the drain electrode; the gate electrode insulating layer is disposed on the semiconductor layer and the first metal barrier layer; and the gate electrode is disposed on the gate electrode insulating layer.

For instance, preferably, as for a bottom-gate TFT which is provided with both the first metal barrier layer and the second metal barrier layer simultaneously, the structure is as follows: the gate electrode is disposed on the substrate; the gate electrode insulating layer is disposed on the gate electrode; the semiconductor layer and the first metal barrier layer are disposed on the gate electrode insulating layer; the second metal barrier layer is disposed on the semiconductor layer and the first metal barrier layer; and the source/drain electrode layer is disposed on the first metal barrier layer.

For instance, preferably, as for a top-gate TFT which is provided with both the first metal barrier layer and the second metal barrier layer simultaneously, the structure is as follows: the source electrode and the drain electrode are disposed on the substrate; the second metal barrier layer is disposed on the source electrode and the drain electrode; the semiconductor layer and the first metal barrier layer are disposed on the second metal barrier layer; the gate electrode insulating layer is disposed on the semiconductor layer and the first metal barrier layer; and the gate electrode is disposed on the gate electrode insulating layer.

The structure of the top-gate TFT provided by embodiment 3 is similar to that of the bottom-gate TFT, for instance, the relevant technical characteristics such as the materials and the setting positions of film layers such as the first metal barrier layer, the second metal barrier layer, the gate electrode insulating layer, the substrate, the ohmic contact layers and the buffer layer are all applicable to the top-gate TFT. The TFT provided by embodiment 3 at least includes the amorphous silicon or polysilicon TFT.

The TFT provided by the present invention is described with reference to embodiments 1 to 3. The TFT provided by the present invention is not limited to the examples provided by embodiments 1 to 3, and any example including the first metal barrier layer and the second metal barrier layer provided by embodiments 1 to 3 should fall within the scope of the present invention.

Embodiment 4

An Array Substrate

The array substrate provided by embodiment 4 of the present invention comprises any type of TFT provided by embodiments 1 to 3. The TFT described below at least includes a metal oxide TFT, an amorphous silicon TFT and a polysilicon TFT. The TFT described below at least comprises a first metal barrier layer. The TFT, for instance, preferably, further comprises a second metal barrier layer.

The array substrate comprises any type of the foregoing TFT which is provided with the first metal barrier layer only.

The array substrate further comprises: a data line and a gate line, wherein the data line is connected with the source electrode of the TFT, and the gate line is connected with a gate electrode of the TFT; and The first metal barrier layer is disposed at a position corresponding to the source electrode, the drain electrode and the data line; or, The first metal barrier layer is disposed at a position corresponding to the source electrode, the drain electrode and the gate line; or, The first metal barrier layer is disposed at a position corresponding to the source electrode, the drain electrode, the gate line and the data line.

The array substrate comprises any type of the foregoing TFT which is provided with both the first metal barrier layer and the second metal barrier layer simultaneously.

The array substrate further comprises: a data line and a gate line, wherein the data line is connected with the source electrode of the TFT, and the gate line is connected with the gate electrode of the TFT;

The first metal barrier layer is disposed at a position corresponding to the source electrode, the drain electrode and the data line; or, the first metal barrier layer is disposed at a position corresponding to the source electrode, the drain electrode and the gate line; or, the first metal barrier layer is disposed at a position corresponding to the source electrode, the drain electrode, the gate line and the data line; and The second metal barrier layer is disposed at a position corresponding to the source electrode, the drain electrode and the data line; or, the second metal barrier layer is disposed at a position corresponding to the source electrode, the drain electrode and the gate line; or, the second metal barrier layer is disposed at a position corresponding to the source electrode, the drain electrode, the gate line and the data line.

Detailed description will be given below with reference to the accompanying drawing. As illustrated in FIG. 1, the array substrate further comprises: a gate line 21 connected with a gate electrode 2 in the TFT and a data line 81 connected with a source electrode 8.

In general, the material of the data line 81 and/or the gate line 21 is the same as that of the source/drain electrode layer or the gate electrode.

On the basis of the foregoing TFT, in order to better prevent the material of the data line and/or the gate line from being diffused to the film layers in the TFT or prevent the interdiffusion of the materials of the data lines and the gate lines, the array substrate comprising the foregoing TFT further comprises: a first metal barrier layer disposed in a corresponding area of the data line and/or a first metal barrier layer disposed in a corresponding area of the gate line.

In order to better prevent the material of the data line and/or the gate line from being diffused to the film layers in the TFT or prevent the interdiffusion of the materials of the data lines and the gate lines, on the basis of arranging the first metal barrier layer in the corresponding area of the data line and/or the gate line, the array substrate further comprises: a second metal barrier layer disposed in a corresponding area of the data line and/or a second metal barrier layer disposed in a corresponding area of the gate line.

The projection area of the first metal barrier layer on the substrate is not less than the area of the source electrode, the drain electrode, the data line and/or the gate electrode at corresponding positions. In addition, the projection area of the second metal barrier layer is not less than the area of the source electrode, the drain electrode, the data line and/or the gate electrode at corresponding positions. Projections of the data line and/or the gate electrode on the substrate are in the projection of the first metal barrier on the substrate, but it should be guaranteed that the relevant positional relationship does not affect the performances of the TFT. In addition, the projections of the data line and/or the gate electrode are in the projection of the second metal barrier layer on the substrate, but it should be guaranteed that the relevant positional relationship does not affect the performances of the TFT.

Figure 8:
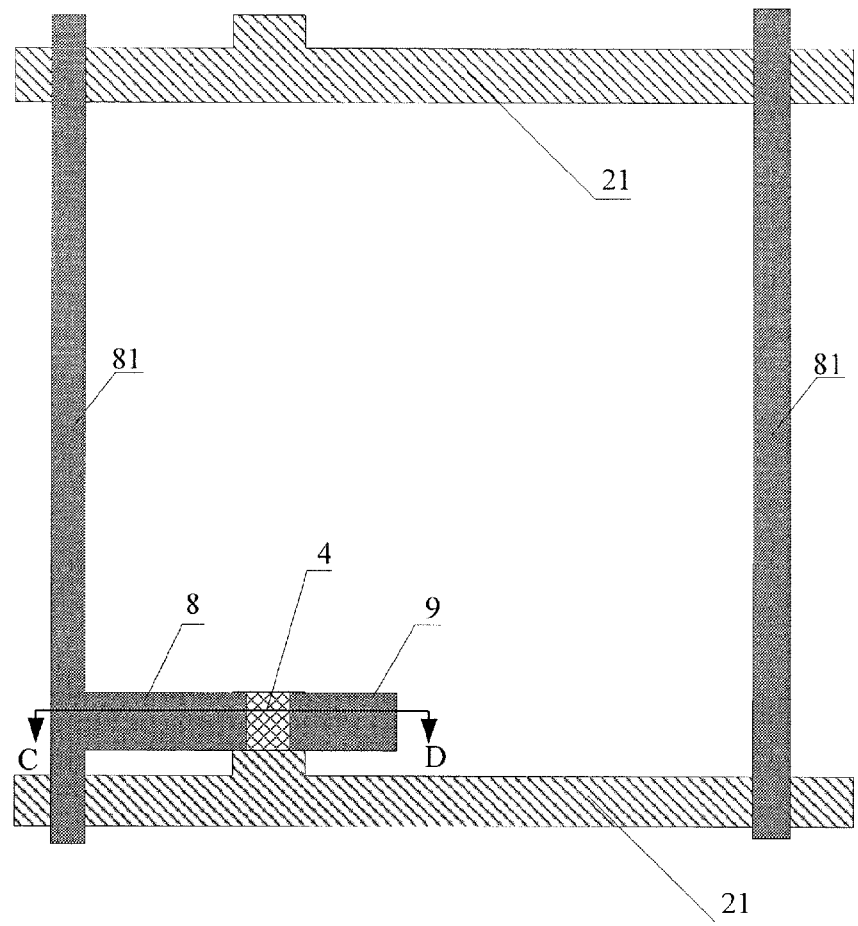
FIG. 8 is a top view of an array substrate provided by embodiment 4 of the present invention.
Figure 9:
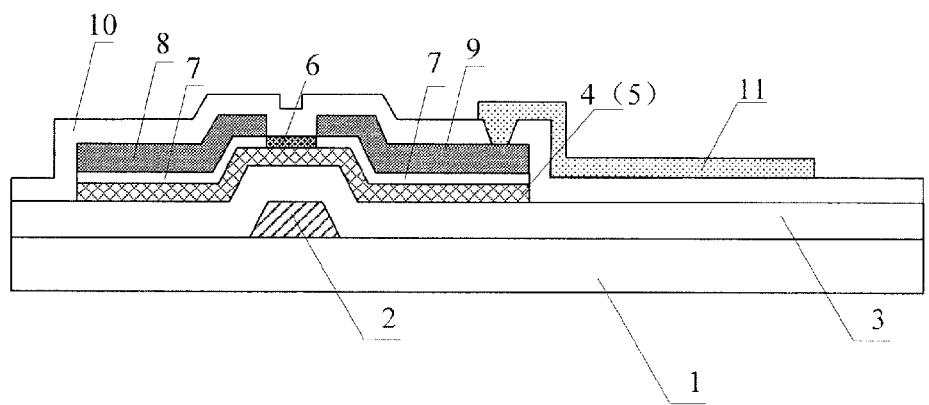
FIG. 9 is a sectional view of the array substrate as shown in FIG. 8 in the C-D direction.

A preferred embodiment is that: as illustrated in FIGS. 8 and 9 (FIG. 9 is a sectional view of the array substrate as shown in FIG. 8 in the C-D direction), both a first metal barrier layer 5 and a second metal barrier layer 7 are disposed in the corresponding areas of a data line 81 and a gate line 21. For instance, the first metal barrier layer 5 is disposed in a corresponding area of a source electrode 8 and a drain electrode 9, and is also disposed in a corresponding area of the gate line 21 and the data line 81.

The second metal barrier layer may also be disposed at a position corresponding to the source electrode, the drain electrode and the data line, or at a position corresponding to the source electrode, the drain electrode and the gate line, or at a position corresponding to the source electrode, the drain electrode, the gate line and the data line, which will not be further described herein.

For instance, preferably, the projection of the first metal barrier layer and/or the second metal barrier layer in the vertical direction is completely overlapped with projections of the data line, the source electrode and the drain electrode on the substrate.

As for the bottom-gate TFT, one example is as follows: firstly, the gate electrode and the gate line are formed; secondly, the first metal barrier layer is formed; and thirdly, the data line is formed; the first metal barrier layer may be disposed on the gate line and/or under the data line. Another example is as follows: the gate line and the data line are formed by same one patterning process, and formed at the same time when the gate electrode is formed, or formed at the same time when the source/drain electrode layer is formed; and the first metal barrier layer may be disposed on the gate line and/or the data line or disposed under the gate line and/or the data line. The main objective is to prevent metal ions of the gate line and the data line from being diffused to the semiconductor layer and hence affect the performances of the TFT.

In the TFT as shown in FIG. 8, the first metal barrier layer is disposed in the corresponding areas of the gate line 21 and the data line 81 respectively. The first metal barrier layer (not shown in FIG. 8) corresponding to the area of the gate line 21 is formed at the same time when the semiconductor layer is formed after the gate line 21 are formed.

As the data line 81 and the source electrode 8 are formed by same one patterning process, the data line 81 and the source electrode 8 are made of the same material. The first metal barrier layer disposed under the data line 81 is formed at the same time when the semiconductor layer 4 is formed before the data line 81 is formed.

The first barrier layer can prevent the metal ions of the data line from being diffused to the gate electrode or the gate line of the TFT or other film layer structures, so as to further improve the performances of the TFT and hence further improve the image display effect of a display device.

For instance, preferably, the array substrate further comprises a buffer layer disposed between the substrate and the conductive layer close to the substrate, and the buffer layer is configured to improve the adhesiveness between the conductive layers and the substrate. For instance, the buffer layers are respectively disposed between the gate line and the substrate and between the first barrier layer and the substrate and configured to respectively improve the adhesiveness between the gate line and the first barrier layer and the substrate.

Of course, the structures of the TFT and the array substrate provided by embodiments 1 to 3 are also applicable to the TFT and the array substrate in which at least one among the source/drain electrode layer, the gate electrode, the data lines and the gate lines is made of metal or alloy of low resistivity and high metal ion diffusibility. For instance, when at least one of the source/drain electrode layer, the gate electrode, the data line and the gate line is made of gold, silver, gold alloy, silver alloy or the like, the TFT and the array substrate provided by the embodiment of the present invention can also solve the problem of reduced semiconductor performance due to the diffusion of metal ions.

As illustrated in FIG. 9, the array substrate provided by the embodiment of the present invention further comprises: a passivation layer 10 disposed on the source/drain electrode layer of the TFT, and a pixel electrode 11 connected with the drain electrode 9 of the TFT. The pixel electrode 11 is connected with the drain electrode 9 via a through hole.

For instance, preferably, the passivation layer provided in the embodiment of the present invention is made of an organic resin material. The organic resin may be benzocyclobutene (BCB) and may be other organic photosensitive material. The organic resin has small hardness compared to an inorganic material and hence is more helpful to planarize the outermost layer of the array substrate and is favorable to achieve the ideal arrangement of liquid crystal molecules between a color filter substrate and the array substrate.

In the present invention, a patterning process may only include a photolithography process or photolithography process and an etching process, and meanwhile, may also include other processes for forming predetermined patterns such as printing, ink-jetting or the like. The photolithography process refers to a set of processes including such as film forming, exposure and development for forming patterns by adoption of photoresist, mask plate, exposure devices and so on. Corresponding patterning processes can be selected according to the structure to be formed in the present invention.

The manors for forming a film layer generally include various methods such as deposition, coating, sputtering or the like. Description will be given below by taking one or several methods as an example. For instance, the process of forming a pattern of the gate electrode on the substrate by a patterning process comprises: firstly, depositing a gate electrode film layer on the substrate; secondly, coating photoresist and forming a photoresist pattern by exposure and development of the photoresist via a mask plate; then, adopting the photoresist pattern as an etching mask and removing corresponding film layer by an etching process and the like; and next, removing the remaining photoresist and finally forming the pattern of the gate electrode on the substrate.

The array substrate will be described in detail by taking the TFT provided by embodiment 2 as an example.

FIG. 1 illustrates the array substrate provided by the embodiment of the present invention. The array substrate comprises the TFT provided by embodiment 2.

Moreover, the array substrate further comprises: a gate line 21 connected with the gate electrode 2 in the TFT, and a data line 81 connected with the source electrode 8.

Figure 10:
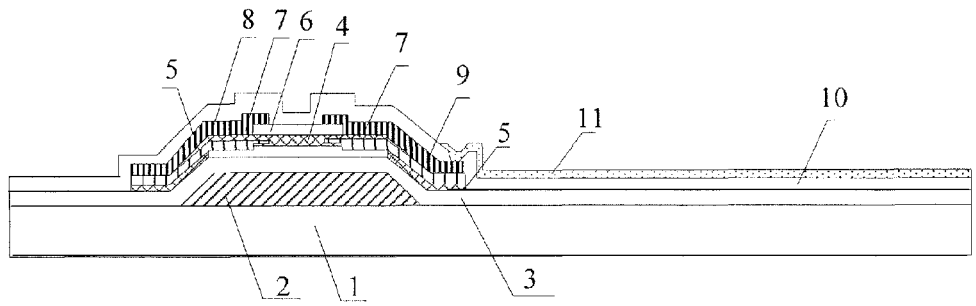
FIG. 10 is a sectional view of the array substrate provided by embodiment 4 of the present invention.

As illustrated in FIG. 10, in the array substrate provided by the embodiment of the present invention, the first metal barrier layer 5 may also be respectively disposed in the corresponding areas of the gate line and the data line (in FIG. 10, the gate line and the data line are disposed under the first metal barrier layer 5, and are not shown in FIG. 10).

As for the bottom-gate TFT, the first metal barrier layer may be disposed on the gate line and/or disposed under the data line.

In the TFT as shown in FIG. 10, the first metal barrier layer 5 is respectively disposed in the corresponding areas of the gate line and the data line (the gate line and the data line are not shown in FIG. 10). That is to say, projections of the first metal barrier layer 5 and/or the second metal barrier layer 7 in the vertical direction are overlapped with projections of the data line, the source electrode 8 and the drain electrode 9 on the substrate 1.

The first metal barrier layer corresponding to an area of the gate line is formed at the same time when the semiconductor layer is formed and after the gate lines are formed.

As the data line and the source electrode are formed by same one patterning process, the data line and the source electrode are made of the same material. The first metal barrier layer is formed at the same time when the semiconductor layer is formed and before the data lines are formed.

The first metal barrier layer can prevent metal ions of the data line from being diffused to the gate electrode, the gate line or other film layer structures of the TFT, and meanwhile, can also prevent metal ions of the gate line or the data line from being diffused to the semiconductor layer, so as to further improve the performances of the TFT and hence further improve the image display effect of the display device.

Similarly, the second metal barrier layer may also be disposed in the corresponding areas of the gate line and the data line, which will not be further described herein.

For instance, preferably, the array substrate further comprises a buffer layer which is disposed between the gate line and the substrate and between the first metal barrier layer and the substrate and configured to improve the adhesiveness of the gate line and the first metal barrier layer with respect to the substrate.

As illustrated in FIG. 9, the array substrate provided by the embodiment of the present invention further comprises: a passivation layer 10 disposed on the source/drain electrode layer of the TFT, and a pixel electrode 11 connected with the drain electrode 9 of the TFT. The pixel electrode 11 is connected with the drain electrode 9 via a through hole, which belongs to the prior art and will not be further described herein.

For instance, preferably, the passivation layer provided in the embodiment of the present invention is made of an organic resin material. The organic resin may be benzocyclobutene (BCB) and may be other organic photosensitive material. The organic resin has small hardness compared to an inorganic material and hence is more helpful to planarize the outermost layer of the array substrate and is favorable to achieve the ideal arrangement of liquid crystal molecules between a color filter substrate and the array substrate.

In the TFT and the array substrate provided by the embodiment of the present invention, the source/drain electrode layer and the data lines may be, but not limited to, made of metallic copper (Cu).

The gate electrode provided by the embodiment of the present invention may be a metal film layer, for instance, may be made of a metal such as chromium (Cr), tungsten (W), titanium (Ti), tantalum (Ta) and molybdenum (Mo) or an alloy formed by at least two metals taken from the above group.

Embodiment 5

A Display Device

The display device provided by the embodiment of the present invention comprises any type of TFT provided by embodiments 1 to 3 or any type of array substrate provided by embodiment 4.

The display device may be an LCD panel, an LCD, an LCD TV, an OLED panel, an OLED display, an OLED TV, electronic paper or the like.

One example of the display device is an LCD, wherein an array substrate and an opposing substrate are arranged opposite to each other to form a liquid crystal cell, and liquid crystal materials are filled into the liquid crystal cell; the opposing substrate is, for instance, a color filter substrate; and a pixel electrode of each pixel cell of the array substrate is configured to apply an electric field to control the rotation degree of the liquid crystal materials so as to achieve the display function. In some examples, the LCD further comprises a backlight module for providing backlight for the array substrate.

Another example of the display device is an OLED display device, wherein a TFT of each pixel cell of an array substrate is connected with an anode or a cathode of the OLED display device and configured to drive organic light-emitting materials to emit light so as to achieve the display function.

The methods for manufacturing the TFT and the array substrate provided by the embodiments of the present invention will be described below from the aspect of technological flow.

Embodiment 6

A Method for Manufacturing the TFT and the Array Substrate

The method for manufacturing the TFT, provided by the present invention will be described below by taking the TFT provided by embodiments 1 to 3 as an example.

The method for forming the TFT comprises: forming patterns of a gate electrode, a source/drain electrode layer and a semiconductor layer; and forming patterns of a gate electrode insulating layer and a first metal barrier layer, in which the gate electrode insulating layer is disposed between the gate electrode and the semiconductor layer; and the first metal barrier layer is disposed between the source/drain electrode layer and the gate electrode insulating layer and arranged on the same layer as and insulated from the semiconductor layer.

As for the TFT which is provided with the first metal barrier layer only, the steps of forming the patterns of the gate electrode, the source/drain electrode layer and the semiconductor layer and forming the patterns of the gate electrode insulating layer and the first metal barrier layer are conducted as follows:

As for a bottom-gate TFT, the method comprises: forming the pattern of the gate electrode on the substrate by a patterning process; forming the pattern of the gate electrode insulating layer on the substrate, on which the pattern of the gate electrode is formed, by a patterning process; forming the patterns of the semiconductor layer and the first metal barrier layer on the substrate, on which the pattern of the gate electrode insulating layer is formed, by one patterning process; and forming the patterns of the source electrode and the drain electrode on the substrate, on which the patterns of the semiconductor layer and the first metal barrier layer are formed, by one patterning process.

As for a top-gate TFT, the method comprises: forming the patterns of the source electrode and the drain electrode on the substrate by one patterning process; forming the patterns of the semiconductor layer and the first metal barrier layer on the substrate, on which the patterns of the source electrode and the drain electrode are formed, by one patterning process; forming the pattern of the gate electrode insulating layer on the substrate, on which the patterns of the semiconductor layer and the first metal barrier layer are formed, by a patterning process; and forming the pattern of the gate electrode on the substrate, on which the pattern of the gate electrode insulating layer is formed, by a patterning process.

Moreover, on the basis of forming the TFT provided with the first metal barrier layer, the method further comprises the process of forming a pattern of a second metal barrier layer, in which the second metal barrier layer is disposed between the first metal barrier layer and the source/drain electrodes.

As for any type of TFT provided by embodiment 1 or 2, namely the TFT provided with an etching barrier layer, the method further comprises the process of forming a pattern of the etching barrier layer, in which the etching barrier layer is disposed between the semiconductor layer and the source/drain electrodes.

Furthermore, the process of forming the patterns of the gate electrode, the source electrode, the drain electrode, the semiconductor layer, the gate electrode insulating layer, the etching barrier layer, the first metal barrier layer and the second metal barrier layer is conducted as follows:

As for a bottom-gate TFT, the method comprises: forming the pattern of the gate electrode on the substrate by a patterning process; forming the pattern of the gate electrode insulating layer on the substrate, on which the pattern of the gate electrode is formed, by a patterning process; forming the patterns of the semiconductor layer and the first metal barrier layer on the substrate, on which the pattern of the gate electrode insulating layer is formed, by one patterning process; forming the pattern of the etching barrier layer on the substrate, on which the patterns of the semiconductor layer and the first metal barrier layer are formed, by a patterning process; and forming the patterns of the source electrode, the drain electrode and the second metal barrier layer on the substrate, on which the pattern of the etching barrier layer is formed, by one patterning process.

As for a top-gate TFT, the method comprises: forming the patterns of the source electrode, the drain electrode and the second metal barrier layer on the substrate by one patterning process; forming the pattern of the etching barrier layer on the substrate, on which the patterns of the source electrode, the drain electrode and the second metal barrier layer are formed, by patterning process; forming the patterns of the semiconductor layer and the first metal barrier layer on the substrate, on which the pattern of the etching barrier layer is formed, by one patterning process; forming the pattern of the gate electrode insulating layer on the substrate, on which the patterns of the semiconductor layer and the first metal barrier layer are formed, by a patterning process; and forming the pattern of the gate electrode on the substrate, on which the pattern of the gate electrode insulating layer is formed, by a patterning process.

For instance, preferably, the process of forming the patterns of the source electrode, the drain electrode and the second metal barrier layer on the substrate, on which the pattern of the etching barrier layer is formed, by one patterning process comprises: forming a copper film layer or a copper alloy film layer on the substrate, on which the pattern of the etching barrier layer is formed, by a film coating process; introducing oxygen, nitrogen or a mixed gas of oxygen and nitrogen of a predetermined ratio into a cavity, in the initial period of forming of the copper film layer or the copper alloy film layer, to form oxide, nitride or oxynitride of copper or copper alloy so as to form the second metal barrier layer, and forming the source electrode and the drain electrode by the copper film layer or the copper alloy film layer except for the portion for the second metal barrier layer; and forming the patterns of the source electrode, the drain electrode and the second metal barrier layer by one exposure, development, photolithography and etching process.

For instance, preferably, the process of forming the patterns of the source electrode, the drain electrode and the second metal barrier layer on the substrate by one patterning process comprises: forming a copper film layer or a copper alloy film layer on the substrate by a film coating process; introducing oxygen, nitrogen or a mixed gas of oxygen and nitrogen of a predetermined ratio into a cavity, in an ending period of forming of the copper film layer or the copper alloy film layer, to form oxide, nitride or oxynitride of copper or copper alloy so as to form the second metal barrier layer, and forming the source electrode and the drain electrode by the copper film layer or the copper alloy film layer except the portion for the second metal barrier layer; and forming the patterns of the source electrode, the drain electrode and the second metal barrier layer by one exposure, development, photolithography and etching process.

In a preferred embodiment corresponding to the embodiment 2, on the basis of the above embodiment (provided with both the first metal barrier layer and the second metal barrier layer), moreover the first metal barrier layer is insulated from the semiconductor layer. The semiconductor layer is made of a metal oxide semiconductor material. In addition, the first metal barrier layer is made of the same material as the semiconductor layer.

As for the TFT provided by embodiment 3, namely the TFT without an etching barrier layer, the process of forming the patterns of the gate electrode, the source electrode, the drain electrode, the semiconductor layer, the gate electrode insulating layer, the etching barrier layer, the first metal barrier layer and the second metal barrier layer is as follows:

As for a bottom-gate TFT, the method comprises: the process of forming the patterns of the gate electrode, the source electrode, the drain electrode, the semiconductor layer, the gate electrode insulating layer, the first metal barrier layer and the second metal barrier layer, which is conducted as follows:

forming the pattern of the gate electrode on the substrate by a patterning process; forming the pattern of the gate electrode insulating layer on the substrate, on which the pattern of the gate electrode is formed, by a patterning process; forming the pattern of the semiconductor layer on the substrate, on which the pattern of the gate electrode insulating layer is formed, by a patterning process; forming the pattern of the first metal barrier layer on the substrate, on which the pattern of the semiconductor layer is formed, by a patterning process; and forming the patterns of the source electrode, the drain electrode and the second metal barrier layer on the substrate, on which the pattern of the first metal barrier layer is formed, by one patterning process.

As for a top-gate TFT, the method comprises: forming the patterns of the source electrode, the drain electrode and the second metal barrier layer on the substrate by one patterning process; forming the pattern of the semiconductor layer on the substrate, on which the patterns of the source electrode, the drain electrode and the second metal barrier layer are formed, by a patterning process; forming the pattern of the first metal barrier layer on the substrate, on which the pattern of the semiconductor layer is formed, by a patterning process; forming the pattern of the gate electrode insulating layer on the substrate, on which the pattern of the first metal barrier layer is formed, by a patterning process; and forming the pattern of the gate electrode on the substrate, on which the pattern of the gate electrode insulating layer is formed, by a patterning process.

For instance, preferably, the process of forming the patterns of the source electrode, the drain electrode and the second metal barrier layer on the substrate, on which the pattern of the first metal barrier layer is formed, by one patterning process comprises: forming a copper film layer or a copper alloy film layer on the substrate, on which the pattern of the first metal barrier layer is formed, by a film coating process; introducing oxygen, nitrogen or a mixed gas of oxygen and nitrogen of a predetermined ratio into a cavity, in an initial period of forming of the copper film layer or the copper alloy film layer, to form oxide, nitride or oxynitride of copper or copper alloy so as to form the second metal barrier layer, and forming the source electrode and the drain electrode by the copper film layer or the copper alloy film layer except the portion for the second metal barrier layer; and forming the patterns of the source electrode, the drain electrode and the second metal barrier layer by one exposure, development, photolithography and etching process.

For instance, preferably, the process of forming the patterns of the source electrode, the drain electrode and the second metal barrier layer on the substrate by one patterning process comprises: forming a copper film layer or a copper alloy film layer on the substrate by a film coating process; introducing oxygen, nitrogen or a mixed gas of oxygen and nitrogen of a predetermined ratio into a cavity, in an ending period of forming of the copper film layer or the copper alloy film layer, to form oxide, nitride or oxynitride of copper or copper alloy so as to form the second metal barrier layer, and forming the source electrode and the drain electrode by the copper film layer or the copper alloy film layer except the portion for the second metal barrier layer; and forming the patterns of the source electrode, the drain electrode and the second metal barrier layer by one exposure, development, photolithography and etching process.

The method for manufacturing the TFT, provided by the present invention, will be described below by taking the TFT provided by embodiment 2 as an example. The method for manufacturing the TFT, provided by the embodiment of the present invention, will be described below from the aspect of the technological flow.

The method for manufacturing the TFT, provided by the embodiment of the present invention, generally comprises: forming the patterns of the gate electrode, the source/drain electrode layer and the semiconductor layer; and forming the patterns of the gate electrode insulating layer, the etching barrier layer and the first metal barrier layer;

the gate electrode insulating layer is disposed between the gate electrode and the semiconductor layer; the etching barrier layer is disposed between the semiconductor layer and the source/drain electrode layer; and the first metal barrier layer is disposed between the source/drain electrode layer and the gate electrode insulating layer and arranged on the same layer and isolated from the semiconductor layer.

Figure 11:
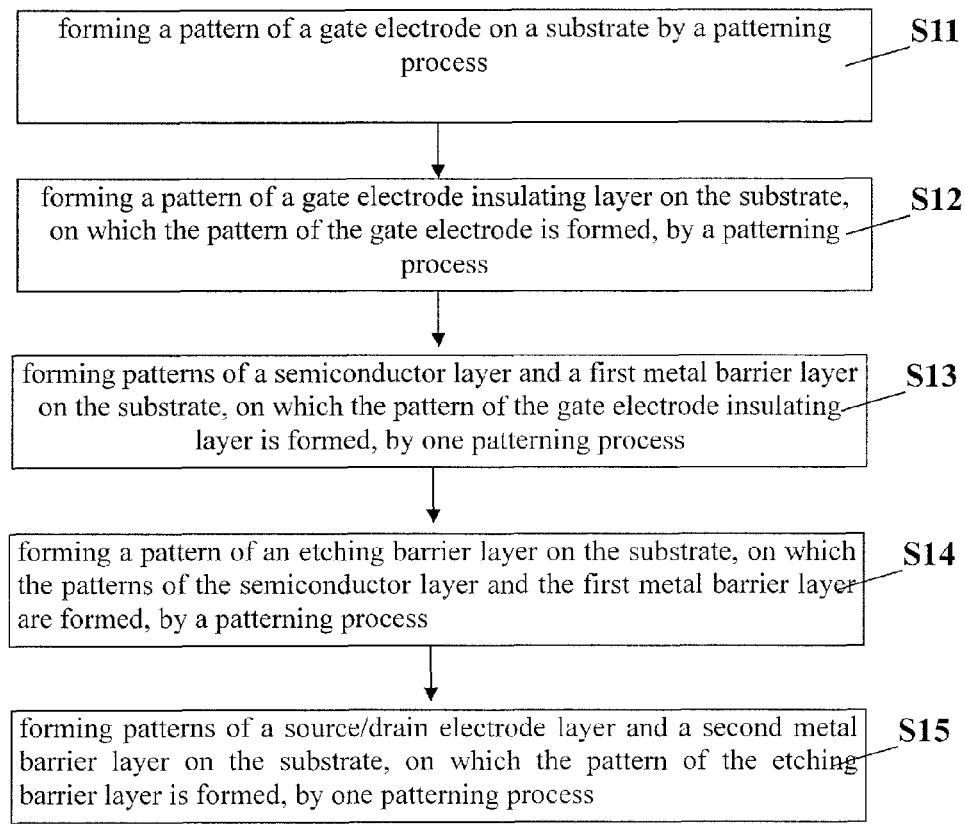
FIG. 11 is a flowchart of a method for manufacturing a bottom-gate TFT, provided by embodiment 6 of the present invention.

As illustrated in FIG. 11, the method for manufacturing a bottom-gate TFT array substrate specifically comprises the following steps of:

S11: forming a pattern of a gate electrode on a substrate by a patterning process;

S12: forming a pattern of a gate electrode insulating layer on the substrate, on which the pattern of the gate electrode is formed, by a patterning process;

S13: forming patterns of a semiconductor layer and a first metal barrier layer on the substrate, on which the pattern of the gate electrode insulating layer is formed, by one patterning process;

S14: forming a pattern of an etching barrier layer on the substrate, on which the patterns of the semiconductor layer and the first metal barrier layer are formed, by a patterning process; and S15: forming patterns of a source/drain electrode layer and a second metal barrier layer on the substrate, on which the pattern of the etching barrier layer is formed, by one patterning process.

Moreover, a metal film layer may be deposited on the substrate, on which the etching barrier layer is formed, by a method of sputtering or thermal evaporation. In addition, oxygen O2 and/or nitrogen N2 of a predetermined ratio is introduced into a sputtering or thermal evaporation cavity in the initial period of the deposition of the metal film layer.

In the case that the process of forming the etching barrier layer is not included, the process of forming the patterns of the source/drain electrode layer and the second metal barrier layer comprises: forming a metal film layer on the substrate, on which the patterns of the semiconductor layer and the first metal barrier layer are formed; and forming the patterns of the source/drain electrode layer and the second metal barrier layer by one patterning process; in which oxygen or nitrogen or a mixed gas of oxygen and nitrogen of a predetermined ratio is introduced into a cavity in the initial period of forming of the metal film layer.

Figure 12:
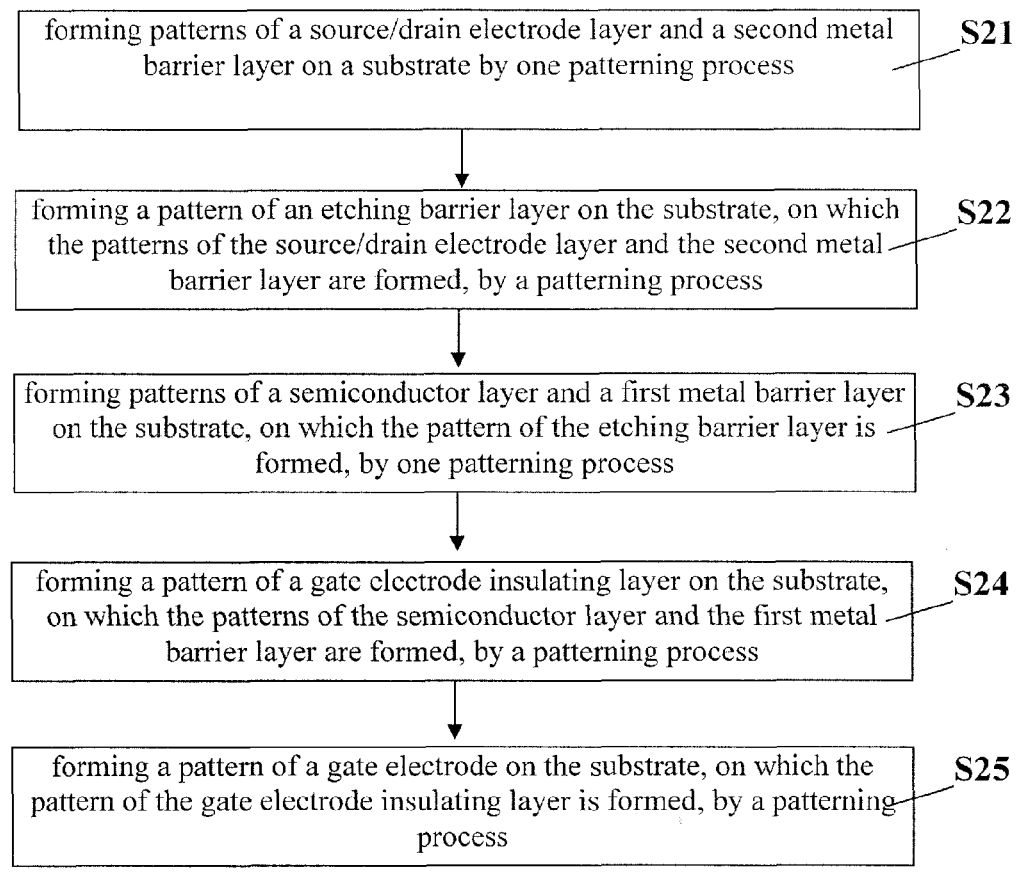
FIG. 12 is a flowchart of a method for manufacturing a top-gate TFT provided by the present invention.

For instance, preferably, as illustrated in FIG. 12, the method for manufacturing a top-gate TFT array substrate specifically comprises the following steps of:

S21: forming patterns of a source/drain electrode layer and a second metal barrier layer on a substrate by one patterning process;

S22: forming a pattern of an etching barrier layer on the substrate, on which the patterns of the source/drain electrode layer and the second metal barrier layer are formed, by a patterning process;

S23: forming patterns of a semiconductor layer and a first metal barrier layer on the substrate, on which the pattern of the etching barrier layer is formed, by one patterning process;

S24: forming a pattern of a gate electrode insulating layer on the substrate, on which the patterns of the semiconductor layer and the first metal barrier layer are formed, by a patterning process; and S25: forming a pattern of a gate electrode on the substrate, on which the pattern of the gate electrode insulating layer is formed, by a patterning process.

For instance, preferably, in the method for manufacturing the TFT array substrate, as shown in FIG. 12, the process of forming the patterns of the source/drain electrode layer and the second metal barrier layer comprises: forming a metal film layer on the substrate; and forming the patterns of the source/drain electrode layer and the second metal barrier layer by one patterning process, in which oxygen or nitrogen or a mixed gas of oxygen and nitrogen of a predetermined ratio is introduced into a cavity in the ending period of forming of the metal film layer.

Moreover, the metal film layer may be deposited on the substrate, on which the etching barrier layer is formed, by a method of sputtering or thermal evaporation. In addition, oxygen or nitrogen or a mixed gas of oxygen and nitrogen of a predetermined ratio is introduced into the sputtering or thermal evaporation cavity in the end period of the deposition of the metal film layer.

In the embodiment of the method of the present invention, at least one of the material for forming the source/drain electrodes and the material for forming the gate electrode is copper or copper alloy. Of course, the invention is not limited thereto, the objective of the embodiment of the present invention is to adopt the first metal barrier layer to prevent the interdiffusion between the material for forming the source/drain electrodes and the material for forming the gate electrode. In addition, other materials for forming the gate electrode, the source electrode and the drain electrode, with strong diffusibility, such as gold and silver, are also applicable to the present invention. Description will be given below by taking the case that the material for forming the source/drain electrodes and the material for forming the gate electrode are metallic copper as an example.

The first metal barrier layer and the semiconductor layer arranged on the same layer in the embodiment of the present invention may be made of the same material. When the semiconductor layer is a metal oxide semiconductor layer, the first metal barrier layer may be made of the material for preparing the metal oxide semiconductor layer. For instance, the material may be indium gallium zinc oxide (IGZO), hafnium indium zinc oxide (HIZO), indium zinc oxide (IZO), amorphous indium zinc oxide (a-InZnO), amorphous fluorine-doped zinc oxide (ZnO:F), tin-doped indium oxide (In2O3:Sn), amorphous molybdenum-doped indium oxide (In2O3:Mo), cadmium tin oxide (Cd2SnO4), amorphous aluminum-doped zinc oxide (ZnO:Al), amorphous niobium-doped titanium oxide (TiO2:Nb), cadmium tin oxide (Cd—Sn—O) or other metal oxides.

The first metal barrier layer and the semiconductor layer arranged on the same layer in the embodiment of the present invention may be made of different materials. When the semiconductor layer is a metal oxide semiconductor layer, the first metal barrier layer may be made of copper oxide (CuOx), copper nitride (CuNy), copper oxynitride (CuNyOx) or the like, or, may be made of other metal oxide different from the metal oxide for forming the semiconductor layer. When the semiconductor layer is an amorphous silicon or polysilicon semiconductor layer, the first metal barrier layer may be made of the material for preparing the metal oxide semiconductor layer and may also be made of copper oxide (CuOx), copper nitride (CuNy), copper oxynitride (CuNyOx) or the like.

The first metal barrier layer and the semiconductor layer arranged on the same layer in the embodiment of the present invention may be insulated or not insulated from each other as long as the performances of the TFT are not affected, which is not limited herein. The insulation arrangement method may be variable. For instance, the first metal barrier layer and the semiconductor layer are insulated from each other by laser cutting, doping process or patterning process directly.

In order to better prevent the interdiffusion between the material for forming the source/drain electrodes and the material for forming the gate electrode, in the embodiment of the present invention, the area of the first metal barrier layer in the orthographic direction should at least completely cover the area of the source/drain electrode layer, but it should be guaranteed that the mutual positional relationship does not affect the performances of the TFT.

In order to better prevent the interdiffusion between the material for forming the source/drain electrodes and the material for forming the gate electrode, in the embodiment of the present invention, the area of the second metal barrier layer in the orthographic direction should at least completely cover the area of the source/drain electrode layer. The specific position is not limited as long as the functions of the TFT are not affected.

In the embodiment of the present invention, the second metal barrier layer may be made of copper oxide (CuOx), copper nitride (CuNy), copper oxynitride (CuNyOx) or the like, or may be also made of a material for forming the metal oxide semiconductor layer, and for instance, the material may be indium gallium zinc oxide (IGZO), hafnium indium zinc oxide (HIZO), indium zinc oxide (IZO), amorphous indium zinc oxide (a-InZnO), amorphous fluorine-doped zinc oxide (ZnO:F), tin-doped indium oxide (In2O3:Sn), amorphous molybdenum-doped indium oxide (In2O3:Mo), cadmium tin oxide (Cd2SnO4), amorphous aluminum-doped zinc oxide (ZnO:Al), amorphous niobium-doped titanium oxide (TiO2:Nb), cadmium tin oxide (Cd—Sn—O) or other metal oxides.

In the embodiment of the present invention, the area of the first metal barrier layer and the second metal barrier layer in the orthographic direction and the mutual positional relationship are not overly limited herein as long as the functions of the TFT are not affected.

The preferred process flow of the method for manufacturing the TFT or the array substrate will be described below by taking the method for manufacturing the array substrate as shown in FIG. 9 or 10 as an example.

It should be noted that: by taking a metal oxide TFT as an example, the first metal barrier layer 5 is made of the same metal oxide with the semiconductor layer 4; the material for forming the source electrode 8 and the drain electrode 9 is copper; and the second metal barrier layer 7 is made of copper oxide (CuOx), copper nitride (CuNy), copper oxynitride (CuNyOx) or the like.

The method for manufacturing the array substrate comprises:

Step 1: Forming Patterns of a Gate Electrode 2 and Gate Line 21.

Firstly, a gate electrode metal film layer is deposited on a substrate by a method of sputtering or thermal evaporation, in which the thickness is preferably 4,000 to 15,000 Å. Secondly, the patterns of the gate electrode 2 and the gate line 21 are formed by one exposure, development, photolithography and etching process. The patterns and the positions of the formed gate electrode 2 and the formed gate line 21 may be the same as those of the prior art and will not be further described herein.

The metal film layer for forming the patterns of the gate electrode 2 and the gate line 21 may be made of a metal such as copper (Cu), chromium (Cr), tungsten (W), titanium (Ti), tantalum (Ta) and molybdenum (Mo) or a metal alloy formed by at least two metals taken from the above group.

Step 2: Forming a Pattern of a Gate Electrode Insulating Layer 3.

An insulating layer is continuously deposited on the substrate, obtained after the step 1, by plasma-enhanced chemical vapor deposition (PEDCVD), and the thickness is preferably 2,000 to 5,000 Å. The insulating layer is the insulating layer for the pattern of the gate electrode insulating layer 2, to be formed. More specifically, the insulating layer may be a silicon oxide layer or a silicon nitride layer. The silicon oxide layer or the silicon nitride layer may be formed by the chemical vapor deposition (CVD) of oxide, nitride or oxynitride with reaction gases. The reaction gases may be a mixture of silane (SiH4), ammonia (NH3) and nitrogen (N2) or a mixture of silicon dichloride (SiH2Cl2), ammonia (NH3) and nitrogen (N2).

In order to improve the performances of the TFT, the pattern of the gate electrode insulating layer 2 may be formed by two insulating layers made of different materials: the first layer is made of silicon nitride (SiNx), and the second layer is made of silicon oxide (SiOx); the gate electrode insulating layer formed by the first layer of silicon nitride (SiNx) makes direct contact with the gate electrode; and the second layer of silicon oxide (SiOx) makes direct contact with the semiconductor layer and the first metal barrier layer. The pattern of the dual-layered gate electrode insulating layer is formed by one exposure, development, photolithography and etching process of two insulating layers.

Step 3: Forming Patterns of a Semiconductor Layer 4 and a First Metal Barrier Layer 5.

Firstly, a metal oxide film layer is continuously deposited by sputtering on the substrate on which the gate electrode insulating layer 3 is formed, and the thickness is preferably 50 to 1,000 Å. Secondly, the patterns of the semiconductor layer 4 and the first metal barrier layer 5 are formed by one exposure, development, photolithography and etching process.

The metal oxide may be indium gallium zinc oxide (IGZO), hafnium indium zinc oxide (HIZO), indium zinc oxide (IZO), amorphous indium zinc oxide (a-InZnO), amorphous fluorine-doped zinc oxide (ZnO:F), tin-doped indium oxide (In2O3:Sn), amorphous molybdenum-doped indium oxide (In2O3:Mo), cadmium tin oxide (Cd2SnO4), amorphous aluminum-doped zinc oxide (ZnO:Al), amorphous niobium-doped titanium oxide (TiO2:Nb), cadmium tin oxide (Cd—Sn—O) or other metal oxides.

The first metal barrier layer 5 is disposed at a position corresponding to a source/drain electrode layer and a data line 81 and at a position corresponding to the gate electrode 2.

The semiconductor layer 4 and the first metal barrier layer 5 are arranged on the same layer, and no extra process is added. In the step, as the pattern of the first metal barrier layer 5 is formed by one patterning process, no extra process is added compared with the prior art, but the function of isolating metal ions of the source/drain electrode layer and the data line can be achieved. The structure can better prevent the diffusion of metal ions, particularly the diffusion of metal ions under high temperature, and hence improve the performances of the TFT.

Step 4: Forming a Pattern of an Etching Barrier Layer 6.

An insulating layer is continuously deposited on the substrate, obtained after the step 3, by PECVD, and the thickness is preferably 1,000 to 3,000 Å. The insulating layer is the etching barrier layer 6. The etching barrier layer 6 may be made of oxide, nitride or oxynitride, and the corresponding reaction gases may be silane (SiH4), ammonia (NH3) and nitrogen (N2) or silicon dichloride (SiH2Cl2), ammonia (NH3) and nitrogen (N2). As similar to the forming of the gate electrode insulating layer, in order to improve the performances of the oxide TFT, the etching barrier layer may be designed into two layers: the first layer is made of silicon nitride (SiNx), and the second layer is made of silicon oxide (SiOx); and the silicon oxide (SiOx) layer makes direct contact with metal oxide. The pattern of the dual-layered etching barrier layer 6 is formed by one exposure, development, photolithography and etching process of two insulating layers.

Step 5: Forming Patterns of a Second Metal Barrier Layer 7 and the Source/Drain Electrode Layer (i.e., a Source Electrode 8 and a Drain Electrode 9).

A metallic copper film is deposited on the substrate by a method of sputtering or thermal evaporation, and the thickness is preferably 1,000 to 6,000 Å. By taking the forming of a metallic copper (Cu) film layer as an example, more specifically, a oxygen (O2), nitrogen (N2) or a mixed gas of O2 and N2 of a predetermined ratio is introduced into a sputtering or thermal evaporation cavity to form a layer of copper nitride (CuNy) (in the case of the introduction of the nitrogen N2), copper oxide (CuOx) (in the case of the introduction of the oxygen O2) or copper oxynitride (CuNyOx) (in the case of the introduction of the mixed gas of O2 and N2), in the initial period Δt of the deposition of the metallic copper (Cu) film layer, and the thickness is preferably 10 Å to 400 Å. The formed copper nitride (CuNy), copper oxide (CuOx) or copper oxynitride (CuNyOx) layer is the second metal barrier layer 7.

The initial period Δt can be set based on experience. The copper nitride (CuNy), the copper oxide (CuOx) or the copper oxynitride (CuNyOx) is stable and can form a stable interface with the oxide semiconductor layer. This substance has the ability of preventing the diffusion of copper (Cu) ions, and the metal oxide semiconductor layer (the first metal barrier layer 5) under this substance has the ability of further preventing the diffusion of copper (Cu) ions and can effectively block copper (Cu) ions penetrating through a copper nitride film. The design can effectively prevent the diffusion of the copper (Cu) ions, and meanwhile, simplifies the manufacturing technique and solves the problem of difficult etching process due to the combination of copper (Cu) and the barrier layer.

The oxygen (O2), nitrogen (N2) or a mixed gas of O2 and N2 of a predetermined ratio introduced into the cavity is stopped in the t–Δt time period. The metal film layer formed in the phase is copper (Cu) metal film layer, namely for the source electrode, the drain electrode and the data line. Here, t can be understood to be the total time required for forming the pattern of the second metal barrier layer and the patterns of the source/drain electrode layer.

The patterns of the second metal barrier layer 7, the source/drain electrode layer and the data line 81 are formed by one exposure, development, photolithography and etching process.

For instance, preferably, the pattern of the second metal barrier layer 7 is the same with and completely overlapped with the patterns of the source electrode 8 and the drain electrode 9 and the pattern of the data line 81.

Step 6: Forming a Pattern of a Passivation Layer 10.

The passivation layer 10 is deposited on the substrate, obtained after the step 5, by PECVD, and the thickness is preferably 2,000 to 10,000 Å. The passivation layer 10 may be made of oxide, nitride or oxynitride. The reaction gases corresponding to the oxidation of silicon may be silane (SiH4) and nitrogen oxide (N2O); and the reaction gases corresponding to the nitride or the oxynitride may be silane (SiH4), ammonia (NH3) and nitrogen (N2) or silicon dichloride (SiH2Cl2), ammonia (NH3) and nitrogen (N2). The passivation layer 10 may be an alumina (Al2O3) film layer or a dual-layered/multi-layered barrier structure.

In addition, a Gate PAD and a SD PAD may also be formed in the process by exposure and development, photolithography and etching process, so that a circuit board can be conveniently connected with the gate line and the data line subsequently.

More specifically, the process for forming the passivation layer 10 is that: one layer of organic resin is coated on the substrate on which the patterns of the source/drain electrode layer and the data line are formed, and the thickness is preferably 4,000 to 30,000 Å. The organic resin may be benzocyclobutene (BCB) or other organic photosensitive material.

After one layer of organic resins is coated, the Gate PAD and the SD PAD in the peripheral area of the array substrate are formed by one exposure, development, photolithography and etching process.

Step 7: Forming a Pattern of a Pixel Electrode 11.

A transparent conductive film layer is deposited on the substrate, obtained after the step 6, by a method of sputtering or thermal evaporation, and the thickness is preferably 300 to 1,500 Å.

The pixel electrode 11 is formed by one exposure, development, photolithography and etching process, and may be made of ITO or IZO or other transparent metal oxide.

The process flow for forming the array substrate provided with the top-gate metal oxide TFT is similar to the process flow for forming the array substrate provided with the bottom-gate metal oxide TFT, namely the step 1 to the step 7, and will not be further described herein.

However, as the second metal barrier layer 7 is subsequently formed on the source/drain electrode layer, the process for forming the second metal barrier layer 7 is different from the process for forming the source electrode 8 and the drain electrode 9. The forming process is as follows: a metal film layer is deposited on the substrate by a method of sputtering or thermal evaporation, in which oxygen (O2) and/or nitrogen (N2) of a predetermined ratio is introduced into a sputtering or thermal evaporation cavity in the end period of the deposition of the metal film layer.

The predetermined ratio of the gases introduced in the present invention is relevant to the thickness of the formed film layers and various technological parameters but will not be limited herein.

Embodiment 7

A Barrier Layer

The embodiment of the present invention provides a barrier layer, which is used as a first metal barrier layer in the TFT or the array substrate which is provided with the first metal barrier layer only provided by the embodiments, to prevent the diffusion of copper or copper alloy.

For instance, preferably, the barrier layer is made of a metal oxide, metal nitride or metal oxynitride having the function of preventing the interdiffusion of the material for forming the source/drain electrodes and the material for forming the gate electrode.

For instance, preferably, the metal oxide is copper oxide (CuOx) having the function of preventing the interdiffusion between the material for forming the source/drain electrodes and the material for forming the gate electrode. The metal oxide may be indium gallium zinc oxide (IGZO), hafnium indium zinc oxide (HIZO), indium zinc oxide (IZO), amorphous indium zinc oxide (a-InZnO), amorphous fluorine-doped zinc oxide (ZnO:F), tin-doped indium oxide (In2O3:Sn), amorphous molybdenum-doped indium oxide (In2O3:Mo), cadmium tin oxide (Cd2SnO4), amorphous aluminum-doped zinc oxide (ZnO:Al), amorphous niobium-doped titanium oxide (TiO2:Nb), cadmium tin oxide (Cd—Sn—O) or other metal oxide having the semiconductor property.

For instance, preferably, the metal oxide is copper nitride, for instance, copper nitride (CuNy), having the function of preventing the interdiffusion between the material for forming the source/drain electrodes and the material for forming the gate electrode.

For instance, preferably, the metal oxide is copper oxynitride, for instance, copper oxynitride (CuNyOx), having the function of preventing the interdiffusion between the material for forming the source/drain electrodes and the material for forming the gate electrode.

The embodiment of the present invention provides another kind of barrier layer, which is used as the first metal barrier layer and/or the second metal barrier layer, in the TFT or the array substrate which is provided with both the first metal barrier layer and the second metal barrier layer simultaneously, to prevent the diffusion of copper or copper alloy.

For instance, preferably, the barrier layer is made of a metal oxide, metal nitride or metal oxynitride having the function of preventing the interdiffusion of the material for forming the source/drain electrodes and the material for forming the gate electrode.

For instance, preferably, the metal oxide is copper oxide (CuOx) having the function of preventing the interdiffusion between the material for forming the source/drain electrodes and the material for forming the gate electrode. The metal oxide may be indium gallium zinc oxide (IGZO), hafnium indium zinc oxide (HIZO), indium zinc oxide (IZO), amorphous indium zinc oxide (a-InZnO), amorphous fluorine-doped zinc oxide (ZnO:F), tin-doped indium oxide (In2O3:Sn), amorphous molybdenum-doped indium oxide (In2O3:Mo), cadmium tin oxide (Cd2SnO4), amorphous aluminum-doped zinc oxide (ZnO:Al), amorphous niobium-doped titanium oxide (TiO2:Nb), cadmium tin oxide (Cd—Sn—O) or other metal oxide having the semiconductor property.

For instance, preferably, the metal oxide is copper nitride, for instance, copper nitride (CuNy), having the function of preventing the interdiffusion between the material for forming the source/drain electrodes and the material for forming the gate electrode.

For instance, preferably, the metal oxide is copper oxynitride, for instance, copper oxynitride (CuNyOx), having the function of preventing the interdiffusion between the material for forming the source/drain electrodes and the material for forming the gate electrode.

The barrier layer is not limited to be applied in the TFT or the array substrate and may be applied in any structure where high-diffusion metal ions are required to be blocked, and will not be enumerated herein.

In summary, the embodiments of the present invention provides a thin film transistor TFT, a first metal barrier layer is disposed between a source/drain electrode layer and a gate electrode insulating layer and configured to effectively prevent metal ions in the source/drain electrode layer from being diffused to the gate electrode insulating layer and a gate electrode, so as to improve the performances of the TFT and image quality. In addition, a second metal barrier layer may be further disposed between the source/drain electrode layer and the first metal barrier layer of the TFT and configured to further prevent the metal ions in the source/drain electrode layer from being diffused to the gate electrode insulating layer and the gate electrode, so as to improve the performances of the TFT and image quality. The array substrate and the display device provided by the embodiments of the present invention respectively comprise the TFT, so as to obtain the display device with high image quality and low signal delay. The barrier layer is made of a metal oxide, metal nitride or metal oxynitride having the function of preventing the interdiffusion of the material for forming the source/drain electrodes and the material for forming the gate electrode. The metal oxide, the metal nitride or the metal oxynitride is common material.

Obviously, various modifications and variations can be made to the present invention by those skilled in the art without departing from the spirit and the scope of the present invention. Therefore, if the modifications and the variations of the present invention fall within the scope of the appended claims and equivalent technology thereof of the present invention, the present invention is also intended to include the modifications and the variations.

The invention claimed is:

1. A thin-film transistor (TFT), comprising:
    a gate electrode, a source electrode, a drain electrode, a semiconductor layer, a gate electrode insulating layer and a first metal barrier layer, which are disposed on a substrate, wherein the gate electrode insulating layer is disposed between the gate electrode and the semiconductor layer; and the first metal barrier layer is disposed between the source/drain electrodes and the gate electrode insulating layer, and the first metal barrier layer is arranged on the same layer as the semiconductor layer and configured to prevent interdiffusion between the material for forming the source/drain electrodes and the material for forming the gate electrode; and
    the thin-film transistor further comprising an etching barrier layer disposed between the source/drain electrodes and the semiconductor layer.

2. The TFT according to claim 1, wherein the first metal barrier layer is insulated from the semiconductor layer.

3. The TFT according to claim 1, wherein the structure of the TFT is as follows:
    the gate electrode is disposed on the substrate;
    the gate electrode insulating layer is disposed on the gate electrode;
    the semiconductor layer and the first metal barrier layer are disposed on the gate electrode insulating layer; and
    the source electrode and the drain electrode are disposed on the first metal barrier layer;
    or, the structure of the TFT is as follows:
    the source electrode and the drain electrode are disposed on the substrate;
    the semiconductor layer and the first metal barrier layer are disposed on the source electrode and the drain electrode;
    the gate electrode insulating layer is disposed on the semiconductor layer and the first metal barrier layer; and
    the gate electrode is disposed on the gate electrode insulating layer.

4. An array substrate, comprising the TFT according to claim 1.

5. The array substrate according to claim 4, wherein the array substrate further comprises: a data line and a gate line, in which the data line is connected with the source electrode of the TFT; the gate line is connected with the gate electrode of the TFT; and
    the first metal barrier layer is disposed at a position corresponding to the source electrode, the drain electrode and the data line; or,
    the first metal barrier layer is disposed at a position corresponding to the source electrode, the drain electrode and the gate line; or,
    the first metal barrier layer is disposed at a position corresponding to the source electrode, the drain electrode, the gate line and the data line.

6. The array substrate according to claim 4, wherein the structure of the TFT is as follows:
the gate electrode is disposed on the substrate;
the gate electrode insulating layer is disposed on the gate electrode;
the semiconductor layer and the first metal barrier layer are disposed on the gate electrode insulating layer; and
the source electrode and the drain electrode are disposed on the first metal barrier layer;
or, the structure of the TFT is as follows:
the source electrode and the drain electrode are disposed on the substrate;
the semiconductor layer and the first metal barrier layer are disposed on the source electrode and the drain electrode;
the gate electrode insulating layer is disposed on the semiconductor layer and the first metal barrier layer; and
the gate electrode is disposed on the gate electrode insulating layer.

7. A display device, comprising the array substrate according to claim 4.

8. The display device according to claim 7, comprising the array substrate according to claim 5.

9. The TFT according to claim 1, wherein the first metal barrier layer is made of a metal oxide, metal nitride or metal oxynitride.

10. The TFT according to claim 9, wherein the metal oxide is indium gallium zinc oxide (IGZO) or copper oxide.

11. The TFT according to claim 9, wherein the metal nitride is copper nitride.

12. The TFT according to claim 9, wherein the metal oxynitride is copper oxynitride.

13. The TFT according to claim 1, wherein at least one of the material for forming the source/drain electrodes and the material for forming the gate electrode is copper or copper alloy.

14. The TFT according to claim 13, wherein the first metal barrier layer is disposed at a position corresponding to the source electrode and the drain electrode.

15. The TFT according to claim 13, wherein the semiconductor layer is a metal oxide semiconductor layer.

16. The TFT according to claim 15, wherein the first metal barrier layer is made of the same material as the semiconductor layer.

17. The TFT according to claim 15, wherein the first metal barrier layer is a copper oxide film layer, a copper nitride film layer or a copper oxynitride film layer.

18. The TFT according to claim 15, wherein the first metal barrier layer is made of a metal oxide semiconductor material different from that of the semiconductor layer.

19. The TFT according to claim 13, further comprising: a second metal barrier layer disposed between the first metal barrier layer and the source/drain electrodes and configured to prevent the interdiffusion between the material for forming the source/drain electrodes and the material for forming the gate electrode.

20. The TFT according to claim 19, wherein the structure of the TFT is as follows:
the gate electrode is disposed on the substrate;
the gate electrode insulating layer is disposed on the gate electrode;
the semiconductor layer and the first metal barrier layer are disposed on the gate electrode insulating layer;
the etching barrier layer is disposed on the semiconductor layer;
the second metal barrier layer is disposed on the semiconductor layer and the first metal barrier layer; and
a source/drain electrode layer is disposed on the second metal barrier layer;
or, the structure of the TFT is as follows:
the source/drain electrode layer is disposed on the substrate;
the second metal barrier layer is disposed on the source/drain electrode layer;
the etching barrier layer is disposed on the second metal barrier layer;
the semiconductor layer and the first metal barrier layer are disposed on the etching barrier layer;
the gate electrode insulating layer is disposed on the semiconductor layer; and
the gate electrode is disposed on the gate electrode insulating layer.

21. The TFT according to claim 19, wherein the structure of the TFT is as follows:
the gate electrode is disposed on the substrate;
the gate electrode insulating layer is disposed on the gate electrode;
the semiconductor layer and the first metal barrier layer are disposed on the gate electrode insulating layer;
the second metal barrier layer is disposed on the semiconductor layer and the first metal barrier layer; and
the source electrode and the drain electrode are disposed on the first metal barrier layer;
or, the structure of the TFT is as follows:
the source electrode and the drain electrode are disposed on the substrate;
the second metal barrier layer is disposed on the source electrode and the drain electrode;
the semiconductor layer and the first metal barrier layer are disposed on the second metal barrier layer;
the gate electrode insulating layer is disposed on the semiconductor layer and the first metal barrier layer; and
the gate electrode is disposed on the gate electrode insulating layer.

22. The TFT according to claim 19, wherein the second metal barrier layer is disposed at a position corresponding to the source electrode and the drain electrode.

23. The TFT according to claim 19, wherein the material for forming the source/drain electrodes is copper or copper alloy.

24. The TFT according to claim 23, wherein the second metal barrier layer is a copper oxide film layer, a copper nitride film layer or a copper oxynitride film layer.

25. The TFT according to claim 23, wherein the second metal barrier layer is made of a metal oxide semiconductor material.

26. An array substrate, comprising the TFT according to claim 19.

27. The array substrate according to claim 26, wherein the array substrate further comprises: a data line and a gate line, in which the data line is connected with the source electrode of the TFT; the gate line is connected with the gate electrode of the TFT;
the first metal barrier layer is disposed at a position corresponding to the source electrode, the drain electrode and the data line; or, the first metal barrier layer is disposed at a position corresponding to the source electrode, the drain electrode and the gate line; or, the first metal barrier layer is disposed at a position corresponding to the source electrode, the drain electrode, the gate line and the data line; and/or
the second metal barrier layer is disposed at a position corresponding to the source electrode, the drain electrode and the data line; or, the second metal barrier layer is disposed at a position corresponding to the source electrode, the drain electrode and the gate line; or, the second metal barrier layer is disposed at a position corresponding to the source electrode, the drain electrode, the gate line and the data line.

28. The array substrate according to claim 26, wherein the structure of the TFT is as follows:
the gate electrode is disposed on the substrate;
the gate electrode insulating layer is disposed on the gate electrode;
the semiconductor layer and the first metal barrier layer are disposed on the gate electrode insulating layer;
the etching barrier layer is disposed on the semiconductor layer;
the second metal barrier layer is disposed on the semiconductor layer and the first metal barrier layer; and
a source/drain electrode layer is disposed on the second metal barrier layer;
or, the structure of the TFT is as follows:
the source/drain electrode layer is disposed on the substrate;
the second metal barrier layer is disposed on the source/drain electrode layer;
the etching barrier layer is disposed on the second metal barrier layer;
the semiconductor layer and the first metal barrier layer are disposed on the etching barrier layer;
the gate electrode insulating layer is disposed on the semiconductor layer; and
the gate electrode is disposed on the gate electrode insulating layer.

29. A display device, comprising the array substrate according to claim 26.

30. The display device according to claim 29, comprising the array substrate according to claim 27.

31. The TFT according to claim 19, wherein the first metal barrier layer is made of a metal oxide, metal nitride or metal oxynitride.

32. The TFT according to claim 31, wherein the metal oxide is IGZO or copper oxide.

33. The TFT according to claim 31, wherein the metal nitride is copper nitride.

34. The TFT according to claim 31, wherein the metal oxynitride is copper oxynitride.

35. A method for manufacturing a thin film transistor (TFT), comprising:
forming patterns of a gate electrode, a source electrode, a drain electrode and a semiconductor layer; and forming patterns of a gate electrode insulating layer and a first metal barrier layer,
wherein the gate electrode insulating layer is disposed between the gate electrode and the semiconductor layer; and the first metal barrier layer is disposed between the source/drain electrodes and the gate electrode insulating layer and arranged on the same layer as the semiconductor layer; and
the method further comprising forming a pattern of an etching barrier layer, in which the etching barrier layer is disposed between the semiconductor layer and the source/drain electrodes.

36. The method according to claim 35, wherein the process of forming the patterns of the gate electrode, the source electrode, the drain electrode, the semiconductor layer, the gate electrode insulating layer and the first metal barrier layer comprises:
forming the pattern of the gate electrode on the substrate by a patterning process;
forming the pattern of the gate electrode insulating layer on the substrate, on which the pattern of the gate electrode is formed, by a patterning process;
forming the patterns of the semiconductor layer and the first metal barrier layer on the substrate, on which the pattern of the gate electrode insulating layer is formed, by one patterning process; and
forming the patterns of the source electrode and the drain electrode on the substrate, on which the patterns of the semiconductor layer and the first metal barrier layer are formed, by one patterning process;
or,
the process of forming the patterns of the gate electrode, the source electrode, the drain electrode, the semiconductor layer, the gate electrode insulating layer and the first metal barrier layer comprises:
forming the patterns of the source electrode and the drain electrode on the substrate by one patterning process;
forming the patterns of the semiconductor layer and the first metal barrier layer on the substrate, on which the patterns of the source electrode and the drain electrode are formed, by one patterning process;
forming the pattern of the gate electrode insulating layer on the substrate, on which the pattern of the semiconductor layer and the first metal barrier layer are formed, by a patterning process; and
forming the pattern of the gate electrode on the substrate, on which the pattern of the gate electrode insulating layer is formed, by a patterning process.

37. The method according to claim 35, wherein the first metal barrier layer is insulated from the semiconductor layer.

38. The method according to claim 37, wherein the semiconductor layer is made of a metal oxide semiconductor material.

39. The method according to claim 35, further comprising forming a pattern of a second metal barrier layer, in which the second metal barrier layer is disposed between the first metal barrier layer and the source/drain electrodes.

40. The method according to claim 39, wherein the process of forming the patterns of the gate electrode, the source electrode, the drain electrode, the semiconductor layer, the gate electrode insulating layer, the first metal barrier layer and the second metal barrier layer comprises:
forming the pattern of the gate electrode on the substrate by a patterning process;
forming the pattern of the gate electrode insulating layer on the substrate, on which the pattern of the gate electrode is formed, by a patterning process;
forming the pattern of the semiconductor layer on the substrate, on which the pattern of the gate electrode insulating layer is formed, by a patterning process;
forming the pattern of the first metal barrier layer on the substrate, on which the pattern of the semiconductor layer is formed, by a patterning process; and
forming the patterns of the source electrode, the drain electrode and the second metal barrier layer on the substrate, on which the pattern of the first metal barrier layer is formed, by one patterning process;
or,
the process of forming the patterns of the gate electrode, the source electrode, the drain electrode, the semiconductor layer, the gate electrode insulating layer, the first metal barrier layer and the second metal barrier layer comprises:
forming the patterns of the source electrode, the drain electrode and the second metal barrier layer on the substrate by one patterning process;

forming the pattern of the semiconductor layer on the substrate, on which the patterns of the source electrode, the drain electrode and the second metal barrier layer are formed, by a patterning process;

forming the pattern of the first metal barrier layer on the substrate, on which the pattern of the semiconductor layer is formed, by a patterning process;

forming the pattern of the gate electrode insulating layer on the substrate, on which the pattern of the first metal barrier layer is formed, by a patterning process; and forming the pattern of the gate electrode on the substrate, on which the pattern of the gate electrode insulating layer is formed, by a patterning process.

41. The method according to claim 39, wherein the process of forming the patterns of the gate electrode, the source electrode, the drain electrode, the semiconductor layer, the gate electrode insulating layer, the etching barrier layer, the first metal barrier layer and the second metal barrier layer comprises:

forming the pattern of the gate electrode on the substrate by a patterning process;

forming the pattern of the gate electrode insulating layer on the substrate, on which the pattern of the gate electrode is formed, by a patterning process;

forming the patterns of the semiconductor layer and the first metal barrier layer on the substrate, on which the pattern of the gate electrode insulating layer is formed, by one patterning process;

forming the pattern of the etching barrier layer on the substrate, on which the patterns of the semiconductor layer and the first metal barrier layer are formed, by a patterning process; and forming the patterns of the source electrode, the drain electrode and the second metal barrier layer on the substrate, on which the pattern of the etching barrier layer is formed, by one patterning process;

or, the process of forming the patterns of the gate electrode, the source electrode, the drain electrode, the semiconductor layer, the gate electrode insulating layer, the etching barrier layer, the first metal barrier layer and the second metal barrier layer comprises:

forming the patterns of the source electrode, the drain electrode and the second metal barrier layer on the substrate by one patterning process;

forming the pattern of the etching barrier layer on the substrate, on which the patterns of the source electrode, the drain electrode and the second metal barrier layer are formed, by a patterning process;

forming the patterns of the semiconductor layer and the first metal barrier layer on the substrate, on which the pattern of the etching barrier layer is formed, by one patterning process;

forming the pattern of the gate electrode insulating layer on the substrate, on which the patterns of the semiconductor layer and the first metal barrier layer are formed, by a patterning process; and forming the pattern of the gate electrode on the substrate, on which the pattern of the gate electrode insulating layer is formed, by a patterning process.

42. The method according to claim 41, wherein the source electrode and the drain electrode are made of copper or copper alloy.

43. The method according to claim 42, wherein the process of forming the patterns of the source electrode, the drain electrode and the second metal barrier layer on the substrate, on which the pattern of the etching barrier layer is formed, by one patterning process comprises:

forming a copper film layer or a copper alloy film layer on the substrate, on which the pattern of the etching barrier layer is formed, by a film coating process; introducing oxygen, nitrogen or a mixed gas of oxygen and nitrogen of a predetermined ratio into a cavity, in an initial period of forming of the copper film layer or the copper alloy film layer, to form oxide, nitride or oxynitride of copper or copper alloy so as to form the second metal barrier layer, and forming the source electrode and the drain electrode by the copper film layer or the copper alloy film layer except the portion for the second metal barrier layer; and forming the patterns of the source electrode, the drain electrode and the second metal barrier layer by one exposure, development, photolithography and etching process;

or, the process of forming the patterns of the source electrode, the drain electrode and the second metal barrier layer on the substrate, on which the pattern of the first metal barrier layer is formed, by one patterning process comprises:

forming a copper film layer or a copper alloy film layer on the substrate, on which the pattern of the first metal barrier layer is formed, by a film coating process; introducing oxygen, nitrogen or a mixed gas of oxygen and nitrogen of a predetermined ratio into a cavity, in an initial period of forming of the copper film layer or the copper alloy film layer, to form oxide, nitride or oxynitride of copper or copper alloy so as to form the second metal barrier layer, and forming the source electrode and the drain electrode by the copper film layer or the copper alloy film layer except the portion for the second metal barrier layer; and forming the patterns of the source electrode, the drain electrode and the second metal barrier layer by one exposure, development, photolithography and etching process.

44. The method according to claim 42, wherein the process of forming the patterns of the source electrode, the drain electrode and the second metal barrier layer on the substrate by one patterning process comprises:

forming a copper film layer or a copper alloy film layer on the substrate by a film coating process; introducing oxygen, nitrogen or a mixed gas of oxygen and nitrogen of a predetermined ratio into a cavity, in an ending period of forming of the copper film layer or the copper alloy film layer, to form oxide, nitride or oxynitride of copper or copper alloy so as to form the second metal barrier layer, and forming the source electrode and the drain electrode by the copper film layer or the copper alloy film layer except the portion for the second metal barrier layer; and forming the patterns of the source electrode, the drain electrode and the second metal barrier layer by one exposure, development, photolithography and etching process.

* * * * *